United States Patent
Embabi et al.

(10) Patent No.: US 8,270,917 B2
(45) Date of Patent: Sep. 18, 2012

(54) CURRENT CONTROLLED BIASING FOR CURRENT-STEERING BASED RF VARIABLE GAIN AMPLIFIERS

(75) Inventors: Sherif H. K. Embabi, Plano, TX (US); Abdellatif Bellaouar, Richardson, TX (US); Michel J. G. J. P. Frechette, Plano, TX (US)

(73) Assignee: Icera Canada ULC, Calgary (CA)

( * ) Notice: Subject to any disclaimer, the term of this patent is extended or adjusted under 35 U.S.C. 154(b) by 483 days.

(21) Appl. No.: 12/520,513

(22) PCT Filed: Dec. 20, 2007

(86) PCT No.: PCT/CA2007/002329
§ 371 (c)(1),
(2), (4) Date: Jun. 19, 2009

(87) PCT Pub. No.: WO2008/074149
PCT Pub. Date: Jun. 26, 2008

(65) Prior Publication Data
US 2010/0093291 A1   Apr. 15, 2010

Related U.S. Application Data

(63) Continuation-in-part of application No. 11/409,092, filed on Apr. 24, 2006.

(60) Provisional application No. 60/871,323, filed on Dec. 21, 2006.

(51) Int. Cl.
*H04B 1/04* (2006.01)

(52) U.S. Cl. .................. 455/127.2; 455/232.1; 455/522; 455/63.1; 455/67.11; 455/258; 455/425; 455/456.5; 455/127.3; 455/323; 455/115.1

(58) Field of Classification Search .... 455/114.2–114.3, 455/127.1, 127.2, 127.5, 343.1; 330/252–261, 330/277, 285, 288–290, 296–297; 327/535
See application file for complete search history.

(56) References Cited

U.S. PATENT DOCUMENTS 4,462,625 A * 7/1984 Barnhill .................. 292/259 R
(Continued)

FOREIGN PATENT DOCUMENTS
WO    WO 99/60698 A1    11/1999

OTHER PUBLICATIONS

European Patent Office, Extended European Search Report for EP 07 85 5611, dated Nov. 22, 2010, 8 pages Netherlands.

(Continued)

*Primary Examiner* — Matthew Anderson
*Assistant Examiner* — Ganiyu A Hanidu

(57) ABSTRACT

An adaptive current control circuit for reduced power consumption and minimized gain shift in a variable gain amplifier. An automatic gain control circuit provides gain control voltages in response to a gain control signal. The gain control voltages are used by the variable gain amplifier to set the gain of the output signal for wireless transmit operations. The adaptive current control circuit receives the same gain control voltages for reducing current to the variable gain amplifier during low gain operation, while providing higher currents during high gain operation. The current that is provided is a hybrid mix of proportional to absolute temperature (PTAT) current and complementary to absolute temperature (CTAT) current for minimizing temperature effects on the gain. The ratio of PTAT current and CTAT current is adjustable for specific temperature ranges to further minimize temperature effects on the gain.

22 Claims, 20 Drawing Sheets

U.S. PATENT DOCUMENTS

| | | | |
|---|---|---|---|
| 5,030,924 A | 7/1991 | Fritz | |
| 5,455,816 A * | 10/1995 | Bitting | 360/67 |
| 5,572,166 A * | 11/1996 | Gilbert | 330/254 |
| 5,646,518 A * | 7/1997 | Lakshmikumar et al. | 323/316 |
| 5,982,201 A * | 11/1999 | Brokaw et al. | 327/53 |
| 5,994,961 A * | 11/1999 | Lunn et al. | 330/254 |
| 6,020,786 A * | 2/2000 | Ashby | 330/256 |
| 6,052,036 A | 4/2000 | Enstrom et al. | |
| 6,084,471 A * | 7/2000 | Ruth et al. | 330/254 |
| 6,329,868 B1 * | 12/2001 | Furman | 327/513 |
| 6,346,848 B1 * | 2/2002 | Shkap | 327/538 |
| 6,426,678 B1 * | 7/2002 | Ko | 330/296 |
| 6,492,874 B1 * | 12/2002 | Shih | 330/288 |
| 6,538,507 B2 | 3/2003 | Prentice et al. | |
| 6,549,590 B2 * | 4/2003 | Myers et al. | 375/344 |
| 6,615,027 B1 * | 9/2003 | Sahota et al. | 455/91 |
| 6,763,228 B2 * | 7/2004 | Prentice et al. | 455/127.2 |
| 6,980,052 B1 * | 12/2005 | Stroet | 330/254 |
| 7,009,444 B1 * | 3/2006 | Scott | 327/535 |
| 7,015,755 B2 * | 3/2006 | Pettersson et al. | 330/254 |
| 7,193,454 B1 * | 3/2007 | Marinca | 327/539 |
| 7,265,629 B2 | 9/2007 | Manku | |
| 7,372,317 B1 * | 5/2008 | Gerstenhaber et al. | 327/535 |
| 7,593,701 B2 * | 9/2009 | Bellaouar et al. | 455/127.2 |
| 2002/0121935 A1 | 9/2002 | Ko | |
| 2002/0149423 A1 | 10/2002 | Prentice et al. | |
| 2003/0034842 A1 * | 2/2003 | Fanous et al. | 330/254 |
| 2006/0141964 A1 * | 6/2006 | Otaka et al. | 455/232.1 |
| 2007/0098041 A1 * | 5/2007 | Seo | 374/170 |
| 2007/0249303 A1 | 10/2007 | Bellaouar et al. | |

OTHER PUBLICATIONS

PCT/CA2007/002329, International Search Report and Written Opinion, 10 pages, Apr. 11, 2008.

* cited by examiner

CURRENT CONTROLLED BIASING FOR CURRENT-STEERING BASED RF VARIABLE GAIN AMPLIFIERS

CROSS REFERENCE TO RELATED APPLICATIONS

This application is a Continuation-In-Part of U.S. patent application Ser. No. 11/409,092, and claims priority to U.S. Provisional Application No. 60/871,323, filed on Dec. 21, 2006.

FIELD OF THE INVENTION

The present invention relates generally to wireless communication systems. More particularly, the present invention relates to automatic gain control in wireless communication systems.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a baseband processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

FIG. 2 is a more detailed circuit schematic of the transmitter core 20 of wireless core 10 shown in FIG. 1. The transmit core 20 includes an up conversion, or mixer circuit 30, a variable gain circuit 32, an automatic gain control (AGC) circuit 34, output pin 36, SAW filter 38, and driver circuit 40. Those of skill in the art will understand that there may be additional components of the transmit core 20 that are not shown in FIG. 2, but are required to enable proper operation of the circuits. Up conversion circuit 30 receives a baseband signal IN to be transmitted, and up converts the baseband signal to a desired transmission frequency z. The upconverted signal is amplified by variable gain circuit 32 in response to signal VGAIN. VGAIN is generated by AGC circuit 34 in response to control voltage VCONT. AGC circuit 34 is responsible for sensing at least one parameter of the device, such as temperature, process and voltage for example, and adjusting the control signal VGAIN to maintain a substantially linear relationship between VCONT and the gain from variable gain circuit 32. The output of variable gain circuit 32 is coupled to off chip SAW filter 38 via output pin 36, for filtering noise of the signal to be transmitted. The filtered signal is then driven by driver circuit 40 to the antenna 18 of the wireless device.

An important function of wireless core 10 is to control transmission signal gain in response to base station requests. Typically, the base station in communication with the wireless device will instruct the wireless device to increase the gain for transmission, since the previously transmitted signals may have been detected as being sub-optimal. Those of skill in the art will understand that the request from the base station is embedded within the communication signal being transmitted to the wireless device. This increase can be specified as being a 10 dB increase, for example. Alternately, the base station can instruct the wireless device to reduce gain, in order to conserve battery power of the wireless device while maintaining optimal performance. To adjust the gain provided by variable gain circuit 32, baseband processor 12 will generate an analog input control voltage signal VCONT for controlling variable gain circuit 32 to provide the desired gain.

As previously mentioned, the relationship between the desired gain and the voltage level of VCONT should be substantially linear, and many standards presently in use specify a close to linear relationship between VCONT and gain. Such standards include EDGE and WCDMA communications standards for example.

Most radio frequency (RF) devices, which typically include gain circuits, are manufactured using SiGe, GaAs, or other heterojunction technologies. Those of skill in the art will understand the advantages provided by SiGe and GaAs devices. GaAs devices have higher electron mobility, run on low power, and generate less noise than traditional CMOS devices, while SiGe heterojunction devices have good forward gain and low reverse gain characteristics, which translate into low current and high frequency performance than typically available from homojunction or traditional bipolar transistors. Gain circuits fabricated with such technologies generally exhibit a substantially linear relationship between gain and VCONT. However, such manufacturing technologies are relatively new, very complex, and hence expensive. Consequently, the costs for manufacturing these RF devices can be prohibitive. Complementary Metal Oxide Semiconductor (CMOS) technology on the other hand, is a very mature and inexpensive fabrication process for the production of semiconductor devices.

FIG. 3 is an example circuit schematic of the up conversion circuit 30 shown in FIG. 2, implemented in CMOS technology. It is noted that the circuit of FIG. 3 is configured for differential signals, and the circuit of FIG. 2 is a simplified schematic representing the differential signal configuration. Up conversion circuit 30 includes dual differential pairs, each for driving a respective phase of the upconverted signal. The first differential pair includes n-channel transistors 50, 52 and 54, where transistor 50 is coupled to VDD through common load resistor R1, and to VSS through transistor 54. Transistor 52 is coupled to VDD through common load resistor R2, and to VSS through transistor 54. The gates of transistors 50 and 52 receive complementary up conversion frequency signals z and z* respectively, while the gate of transistor 54 receives one phase of input baseband signal IN.

The second differential pair includes n-channel transistors 56, 58 and 60, where transistor 58 is coupled to VDD through common load resistor R2, and to VSS through transistor 60. Transistor 56 is coupled to VDD through common load resistor R1, and to VSS through transistor 60. The gates of transistors 56 and 58 receive complementary up conversion frequency signals z* and z respectively, while the gate of transistor 60 receives the opposite phase of the input baseband signal, labelled IN*. The operation of up conversion circuit 30 is well known to those of skill in the art. The circuit multiplies the baseband input signal IN/IN* with the up conversion frequency z/z* to provide corresponding output signals OUT and OUT*. The first differential pair drives output signal OUT while the second differential pair drives opposite phase output signal OUT*.

FIG. 4 is an example circuit schematic of the variable gain circuit 32 shown in FIG. 2, implemented in CMOS technology. It is noted that the circuit of FIG. 4 is configured for differential signals, and the circuit of FIG. 2 is a simplified schematic representing the differential signal configuration. The variable gain circuit includes two differential pair circuits, similar to the ones shown in FIG. 3. The first differential pair includes n-channel transistors 70, 72 and 74, where transistor 70 is coupled directly to VDD, and to VSS through transistor 74. Transistor 72 is coupled to VDD through load resistor R3, and to VSS through transistor 74. The gates of transistors 70 and 72 receive differential gain control voltage V_GAIN− and V_GAIN+ respectively, while the gate of transistor 74 receives signal OUT* from up conversion circuit 30 of FIG. 3. It is noted that OUT* in FIG. 3 can be coupled as in FIG. 4 via a coupling capacitor (not shown).

The second differential pair includes n-channel transistors 76, 78 and 80, where transistor 76 is coupled directly to VDD, and to VSS through transistor 80. Transistor 78 is coupled to VDD through load resistor R4, and to VSS through transistor 80. The gates of transistors 76 and 78 receive differential gain control voltage V_GAIN− and V_GAIN+ respectively, while the gate of transistor 80 receives signal OUT from up conversion circuit 30 of FIG. 3. It is noted that OUT in FIG. 3 can be coupled as in FIG. 4 via a coupling capacitor (not shown).

The operation of variable gain circuit 32 is well known to those of skill in the art. Maximum gain of signals OUT* and OUT is obtained when V_GAIN+ is at a maximum voltage level, and minimum gain of signals OUT* and OUT is obtained when V_GAIN+ is at a minimum voltage level. The first differential pair drives output signal Vpin+ from a corresponding output pad, while the second differential pair drives opposite phase output signal Vpin− from another corresponding output pad. These output pads correspond to output pad 36 shown in FIG. 2.

Ideally, baseband signal IN/IN* is upconverted and amplified linearly and with minimum noise as output signals Vpin+/Vpin− such that they can meet the minimum requirements for one or more of the previously mentioned communication standards. Unfortunately, the CMOS variable gain circuit 32 does not exhibit a substantially linear characteristic between gain and the input control voltage VCONT, which is equal to V_GAIN+-V_GAIN−. In fact, CMOS transistors in general do not exhibit substantially linear voltage-current characteristics. It is for this reason that AGC circuit 34 must be included to compensate for any introduced signal non-linearities due to the inherent non-linearity of CMOS transistors. Those of skill in the art will further understand that the non-linearity of CMOS transistors can be further complicated by PVT (process, voltage, temperature) variations. Those of skill in the art will appreciate that any one of these variants can affect the operating characteristics of transistor devices, and ultimately, the gain characteristics of the circuit.

Of the PVT variants described, process and voltage are generally static variants that typically do not change during operation of the wireless device. Temperature on the other hand, can change significantly during normal operation of the wireless device. FIG. 5 is a graph illustrating example gain responses of a variable gain circuit as a function of control voltage VCONT for different operating temperatures. Curves 90, 92 and 94 are the gain-VCONT relationships at 85, 22.5 and −40 degrees Celsius, respectively. While all three curves are substantially linear, the variance with temperature, and therefore overall linearity of the variable gain circuit, is not achieved since the amount of gain can vary by as much as 20 dB for a given VCONT value.

There are various techniques and corresponding gain control circuit implementations for AGC 34 that are known in the art for ensuring that actual gain of the variable gain circuit 32 follows a linear relationship with the control voltage VCONT. Commonly owned U.S. application Ser. No. 11/092,566, which is incorporated by reference, discloses a digital system for gain control by monitoring any one of temperature, supply voltage and process parameters, and generating a corresponding compensated gain control voltage for a variable gain circuit. Persons skilled in the art will understand that the above-described AGC system represents one possible technique for correcting/compensating for the inherent non-linear properties of CMOS circuits. Other possible AGC systems can include feedback systems or systems that employ reference circuits.

While the previously discussed AGC circuit effectively establishes a substantially linear relationship between the gain control signal VCONT and the actual gain from variable gain circuit 32, the effective range is limited to about 40 dB. This is sufficient for standards such as GSM and EDGE, but standards such as WCDMA require a higher minimum range of about 85 dB. Therefore, any wireless core employing such an AGC circuit will not meet the WCDMA standard. This is mainly due to the inherent non-linear behaviour of CMOS transistors operating in a saturation mode.

Those of skill in the art will understand that CMOS circuits, such as the variable gain circuit 32, are typically operated in the saturation mode. Although the saturated transistor operates as an ideal current source, it will have a non-linear relationship between its drain current (Id) and its gate-source voltage (Vgs). Furthermore, to keep the transistor operating in the saturation mode, the transistor drain-source voltage (Vds) must be greater than or equal to Vgs-Vt, where Vt is the threshold voltage of the transistor. Hence voltage headroom is reduced, which can lead to clipping of the input signal.

In addition to standards specifying gain characteristics, there are standards governing the maximum amount of allowable noise in the resulting upconverted and amplified signal. Unfortunately, the circuit of FIG. 2 requires the addition of SAW filter 38 to remove unwanted noise from the signal that is generated within up conversion circuit 30, variable gain circuit 32, and even from AGC circuit 34.

With reference to the circuit schematics of FIG. 3 and FIG. 4, noise is introduced in each current to voltage and voltage to current conversion stage of the circuits. Starting in the up conversion circuit 30 of FIG. 3, signals IN/IN* are voltage signals switching transistors 54 and 60 on and off to generate currents through transistors 50, 52, 56 and 58. These currents are then converted to voltage signals OUT/OUT* and provided to the variable gain circuit 34. At the variable gain circuit 32, voltage signals OUT/OUT* switch transistors 74 and 80 on and off to generate signal currents through transistors 72 and 78. These currents are then converted to voltage signals Vpin+/Vpin−. Each voltage to current and current to voltage conversion stage will introduce noise into the resulting output signals Vpin+/Vpin−. In addition to noise, the numerous voltage to current and current to voltage conversion stages will consume current and therefore waste power, which is a limited resource in mobile wireless devices.

CMOS transmitter circuits, especially up conversion circuits, variable gain circuits, and automatic gain circuits are less costly to manufacture than their more exotic bipolar counterparts. While the inherent non-linearity of CMOS variable gain circuits can be compensated/corrected with existing circuits, they are limited to a 40 dB range that is insufficient for WCDMA standards. Furthermore, the noise added by the mixer circuit and the variable gain circuit necessitates an off-chip SAW filter discrete component, potentially increasing the wireless device form factor and cost due to the additional device.

It is, therefore, desirable to provide a CMOS transmitter with a gain system for providing a high range of gain and linear operation, while minimizing noise.

SUMMARY OF THE INVENTION

It is an object of the present invention to obviate or mitigate at least one disadvantage of the prior art.

In a first aspect, the present invention provides a gain system for a wireless transmitter core. The gain system includes an automatic gain control circuit, a variable gain amplifier, and a current controller. The automatic gain control circuit provides differential gain control signals corresponding to a level of gain in response to a control signal. The automatic gain control circuit controls the differential gain control voltages to have a linear relationship with the control signal. The variable gain amplifier receives a variable current for amplifying a data signal with the level of gain in response to the differential gain control signals, such that an output power of the variable gain amplifier varies between a minimum output power and a maximum output power. The current controller adjusts the variable current in response to the differential gain control signals. The current controller minimizes the variable current at the minimum output power and maximizes the variable current at the maximum output power. According to an embodiment of the present aspect, the current control circuit includes a current steering circuit and a current mirror circuit. The current steering circuit steers a portion of a bias current to an output node as a reference current in response to a first control voltage of the differential gain control voltages. The current mirror circuit receives the reference current and generates the variable current corresponding in magnitude to the reference current. The current steering circuit can include a first input n-channel transistor, a second input n-channel transistor, and a bias current source. The first input n-channel transistor is connected in series between a load device coupled to VDD and a common node, where its gate is coupled to the first control voltage. The second input n-channel transistor is connected in series between the current mirror circuit and the common node, where its gate is coupled to a second control voltage of the differential gain control voltages. The bias current source is coupled to the common node for providing the bias current.

In a further aspect of the present embodiment, the variable gain amplifier includes an input stage, a mirror transistor and a diode-connected transistor. The input stage couples a current to a differential amplification stage in response to the data signal, and the differential amplification stage provides an amplified signal corresponding to the data signal in response to the differential gain control voltages. The mirror transistor provides the current to the input stage, and the diode-connected transistor receives the variable current, where the diode-connected transistor is arranged in a current mirror configuration with the mirror transistor. Furthermore, the bias current source includes a hybrid current source for providing a combination of proportional to absolute temperature (PTAT) current and complementary to absolute temperature (CTAT) current. The hybrid current source can include an adjustable PTAT current source for providing the PTAT current, an adjustable CTAT current source for providing the CTAT current, a current summer for combining the PTAT current and the CTAT current, and a mirror transistor. The current mirror transistor being arranged in a current mirror configuration with the current summer for providing the bias current, where the bias current has a magnitude corresponding to the sum of the PTAT current and the CTAT current.

According to yet another aspect of the present embodiment, the adjustable PTAT current source includes at least two PTAT current sources for providing different PTAT currents and a PTAT switch circuit for selectively coupling at least one of the at least two PTAT current sources to a common node for providing the PTAT current. The adjustable CTAT current source includes at least two CTAT current sources for providing different CTAT currents, and a CTAT switch circuit for selectively coupling at least one of the at least two CTAT current sources to another common node for providing the CTAT current. The adjustable PTAT current source is programmed to provide a first ratio factor of the bias current and the adjustable CTAT current source is programmed to provide a second ratio factor of the bias current, where the first ratio factor and the second ratio factor sum to approximately 1. The adjustable PTAT current source is programmed in response to a first ratio control word and the adjustable CTAT current source is programmed in response to a second ratio control word.

In yet a further aspect of the present embodiment, the first ratio control word and the second ratio control word are adjusted in response to a sensed temperature. The gain system further includes a temperature sensor and a temperature decoder. The temperature sensor providing an analog signal corresponding to the sensed temperature. The temperature decoder generating the first ratio control word and the second ratio control word in response to the analog signal received from the temperature sensor. The temperature decoder includes an analog to digital converter, a first decoder, and a second decoder. The analog to digital converter provides a digital output signal corresponding to the analog signal. The first decoder receives the digital output signal and generates the first ratio control signal. The second decoder receives the digital output signal and generates the second ratio control signal.

In a second aspect, the present invention provides a gain system for a wireless transmitter core. The gain system including a variable gain amplifier, a temperature sensor, a temperature decoder, and a current controller. The variable gain amplifier receives a variable current for amplifying a data signal with the level of gain in response to differential gain control signals, such that an output power of the variable gain amplifier varies between a minimum output power and a maximum output power. The temperature sensor provides an analog signal corresponding to a sensed temperature. The temperature decoder generates a first ratio control word and a second ratio control word in response to the analog signal received from the temperature sensor. The current controller provides a proportional to absolute temperature current (PTAT) in response to the first ratio control word and a complementary to absolute temperature current (CTAT) in response to the second ratio control word. The current controller sums the PTAT current and the CTAT current to provide the variable current. In an embodiment of the present aspect, the current controller includes a PTAT current steering circuit, a CTAT current steering circuit, and a current weighting circuit. The PTAT current steering circuit generates the PTAT current in response to the differential gain control signals. The CTAT current steering circuit generates the CTAT current in response to the differential gain control signals. The current weighting circuit receives the PTAT current and the CTAT current, and provides the variable current corresponding to a sum of the PTAT current, a supplemental PTAT current, the CTAT current and a supplemental CTAT current.

In an aspect of the present embodiment, the current weighting circuit includes an adjustable PTAT current source for providing the supplemental PTAT current in response to the first ratio control word, and an adjustable CTAT current source for providing the supplemental CTAT current in response to the second ratio control word. The adjustable PTAT current source includes at least two PTAT current sources and a PTAT switch circuit. The at least two PTAT current sources provide different PTAT currents. The PTAT switch circuit selectively couples at least one of the at least two PTAT current sources to a voltage supply (VDD or VSS) for providing the supplemental PTAT current. The adjustable CTAT current source includes at least two CTAT current sources for providing different CTAT currents. The CTAT switch circuit selectively couples at least one of the at least two CTAT current sources to the voltage supply (VDD or VSS) for providing the supplemental CTAT current. The voltage supply can be VDD, or the voltage supply can be VSS such that the supplemental PTAT current and the supplemental CTAT current are negative currents.

In a further aspect, the PTAT current steering circuit includes a pair of input n-channel transistors, a PTAT current source and a current mirror circuit. The pair of input n-channel transistors are connected in parallel to a common node, and are controlled by the differential gain control signals for providing a portion of a PTAT reference current. The PTAT current source is coupled to the common node for providing the PTAT reference current. The current mirror circuit receives the PTAT reference current and generates the PTAT current corresponding in magnitude to the PTAT reference current. The CTAT current steering circuit includes another pair of input n-channel transistors, a CTAT current source, and another current mirror circuit. The another pair of input n-channel transistors is connected in parallel to a another common node, and are controlled by the differential gain control signals for providing a portion of a CTAT reference current. The CTAT current source is coupled to the another common node for providing the CTAT reference current. The another current mirror circuit receives the CTAT reference current and generates the CTAT current corresponding in magnitude to the CTAT reference current.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a CMOS automatic gain control (AGC) circuit that receives an analog control voltage and generates a temperature compensated gain voltage to linearly control the gain of a variable gain circuit operating in the sub-threshold region. A PTAT circuit having a resistor network coupled to a current mirror circuit operating in the sub-threshold region establishes a current having an proportional relationship to temperature. This current is used as a supply for a voltage to voltage converter circuit, which generates an intermediate voltage in response to the analog control voltage. A linearizing circuit operating in the sub-threshold region pre-conditions the intermediate voltage, which is then applied to a variable gain circuit. The variable gain circuit is operated in the sub-threshold region, and the preconditioned intermediate voltage will control the amount of gain to be substantially linear with respect to the analog control voltage, and with a range of about 45 dB. If two gain stages are connected, a total range of 90 dB is achieved.

According to another embodiment of the present invention, the variable gain circuit operated in the sub-threshold region can be merged with the up conversion circuit to reduce the number of voltage to current and current to voltage conversion stages. Hence the amount of noise generated during their operation can be reduced. This can be done because the Vds of the sub-threshold transistors no longer have to maintain the relationship Vds>Vgs−Vt, which is required for operation in the saturation region. Therefore, minimal voltage supply headroom is consumed. Furthermore, the current source of the mixer circuit can be configured to include an on-chip low pass filter to remove out of band noise, which is sufficient to render the external filter device unnecessary.

Figure 4:
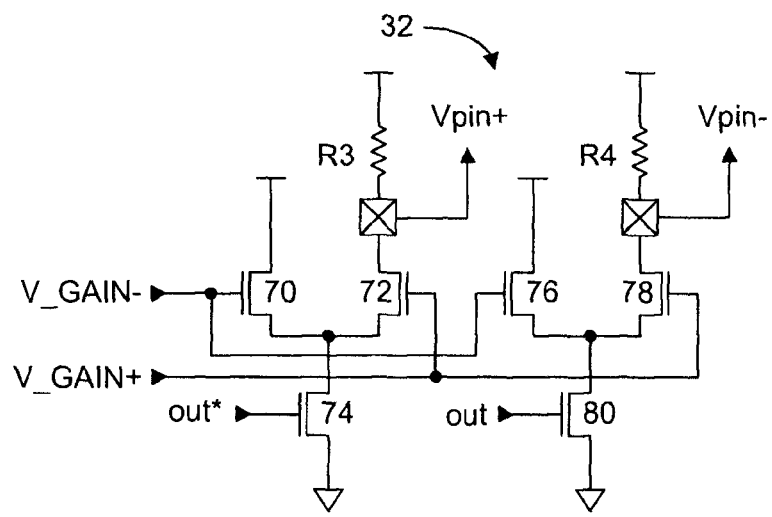
FIG. 4 is a circuit schematic of a CMOS gain circuit of the prior art.
Figure 5:
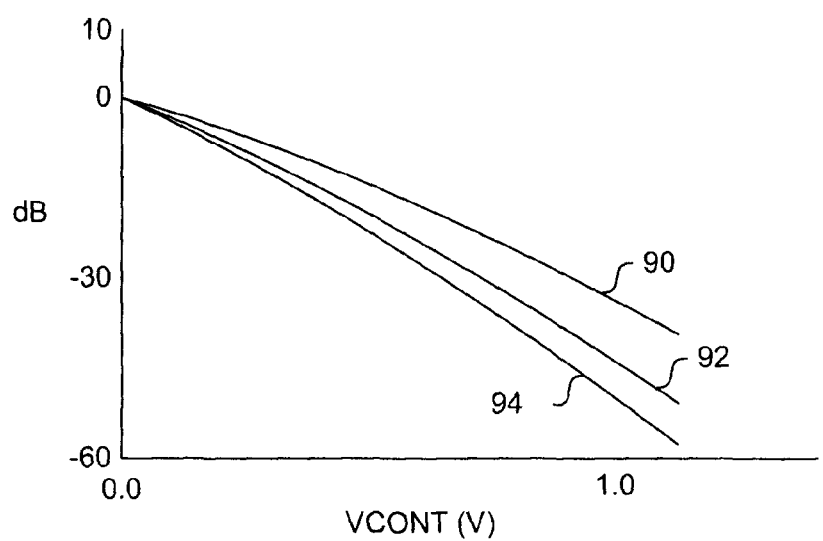
FIG. 5 is a plot of gain versus gain control voltage for different operating temperatures.

As will be described later, CMOS variable gain circuits such as the circuits shown in FIG. 4, are biased to operate in a sub-threshold region. Those of skill in the art will understand that a CMOS n-channel transistor operates in the sub-threshold region when Vgs<Vtn, where Vtn is the threshold voltage of the n-channel transistor. While a drain current will flow through the transistor in sub-threshold operation, this drain current will be exponentially related to Vgs. This characteristic is similar to the collector current and base/emitter voltage of a BJT transistor. This characteristic is very advantageous for gain circuit applications because a linear gain relationship to an input control voltage can be inherently obtained. This relationship is shown in equation 1 below:

$$Id = \text{Const} \times e^{qVgs/kTN}, \quad (1)$$

where Const and N are constants, k is Boltzmann's constant, q is electronic charge, T is temperature in Kelvin, and N is a slope parameter.

Using the first differential pair of variable gain circuit 32 shown in FIG. 4 by example, if transistors 70 and 72 are in sub-threshold, the resulting linear gain is characterized by equation 2 below:

$$G = (I_{72}/I_{74})dc = 1/(1 + e^{(-v\_GAIN/nVt)}), \quad (2)$$

where G is gain, $I_{72}$ is the dc current through transistor 72, $I_{74}$ is the dc current through transistor 74, n is a constant of the transistor and Vt is the threshold voltage. Equation 2 expressed in dB appears in equation 3 below:

$$GdB = -ln(1 + e^{(-V\_GAIN/nVt)}) \quad (3)$$

As shown in equation (1), the sub-threshold drain current has an undesired temperature dependency. As shown in equation (3), the "1" term adversely impacts the linearity of the gain circuit. Therefore, the gain control circuit of the present invention will compensate for the temperature dependency of the variable gain circuit, and generate an offset term to cancel the "1" in equation (3).

Figure 6A:
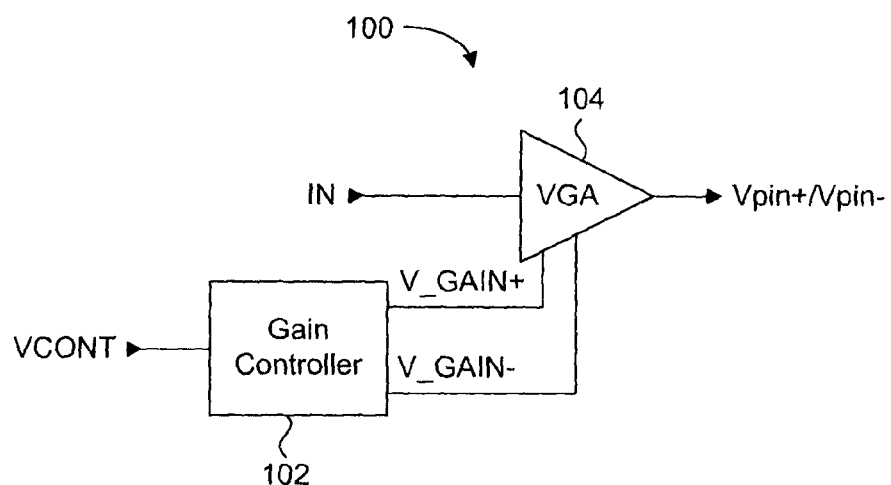
FIG. 6a is a block diagram of a low noise CMOS gain control circuit according to an embodiment of the present invention.

FIG. 6a is a block diagram of a gain system according to an embodiment of the present invention. Gain system 100 generally includes a gain control circuit 102 and a variable gain circuit 104. Gain system 100 is preferably implemented in the transmitter core of a wireless device, and more specifically can replace components 30, 32 and 34 of FIG. 2. The gain control circuit 102 receives an input control voltage VCONT and generates differential corresponding gain signals V_GAIN+/V_GAIN− for controlling the gain of variable gain circuit 104. As will be described later, gain signals V_GAIN+/V_GAIN− are controlled to have a substantially linear relationship with VCONT. In response to gain signals V_GAIN+/V_GAIN−, the variable gain circuit will amplify the data signal IN from the baseband processor (not shown) as differential output signals Vpin+/Vpin−, with a certain amount of gain dictated by VCONT.

Figure 6B:
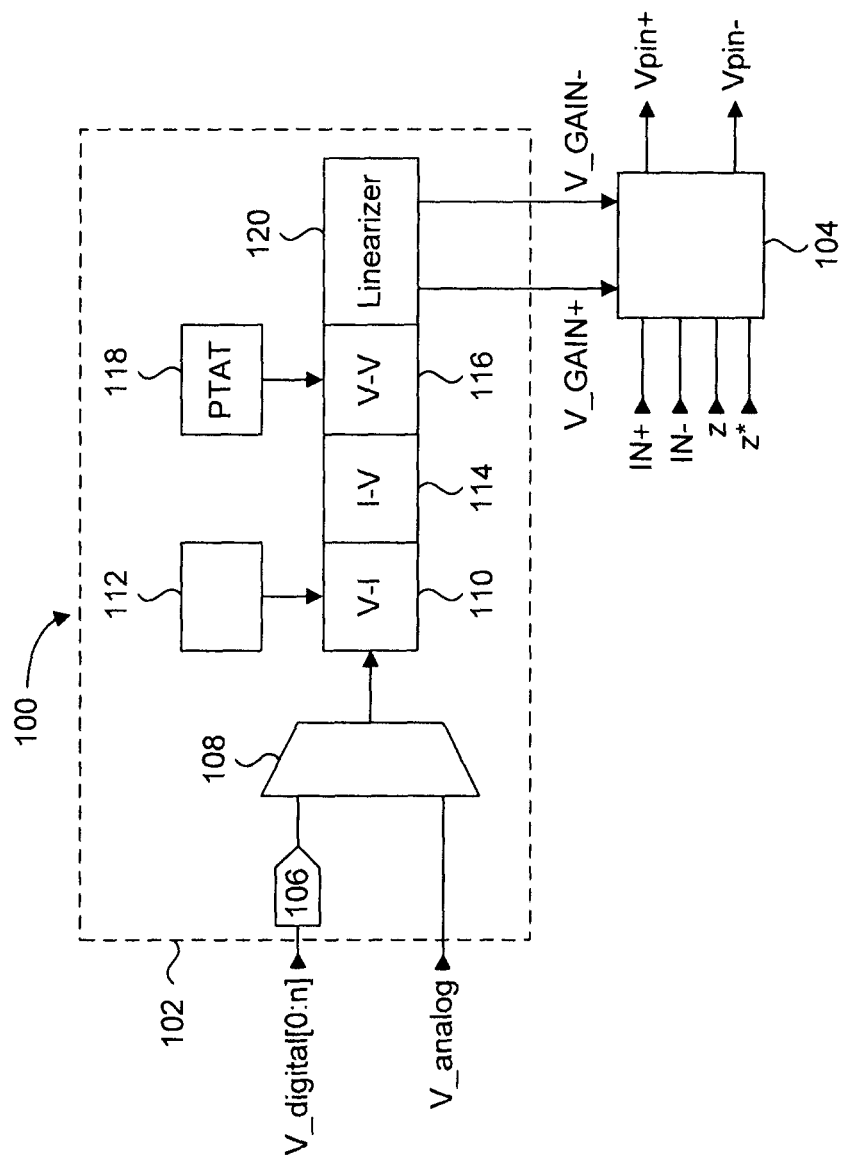
FIG. 6b is a block diagram of the low noise CMOS gain control circuit of FIG. 6a, according to an embodiment of the present invention.

Further details of the gain system according to an embodiment of the present invention are shown in FIG. 6b. The gain control circuit 102 receives an input control voltage and generates differential corresponding gain signals V_GAIN+/V_GAIN− for controlling the gain of variable gain circuit 104. Variable gain circuit 104 can optionally include separate up conversion and gain circuits, or a merged up conversion and variable gain circuit according to an embodiment of the present invention to be discussed later. The variable gain circuit 104 receives the differential baseband signal IN+/IN− to be transmitted, up converts them to frequency signal z/z*, and generates differential output signals Vpin+/Vpin− for downstream circuits such as the driver circuit 40 shown in FIG. 2.

A more detailed description of gain control circuit 102 now follows. In the presently shown embodiment of FIG. 6b, gain control circuit 102 includes a digital to analog converter (DAC) 106, multiplexor circuit 108, a voltage to current converter circuit 110, a current control circuit 112, a current to voltage circuit 114, a voltage converter circuit 116, a PTAT circuit 118, and a linearizer circuit 120.

Multiplexor circuit 108 selectively couples one of two input control voltage signals to the voltage to current converter circuit 110. The first signal can be an analog voltage V_analog from a pin of the chip, and the second signal can be a digital signal V_digital[0:n] converted to an analog voltage via DAC 106. V_digital[0:n] can be provided by the base band processor or other digital source, and can be n-bits wide to match the resolution of the DAC 106.

Voltage to current converter circuit 110 is a standard well-known circuit for converting the input voltage from multiplexor circuit 108 into current. The purpose of converting the input voltage to current is to facilitate manipulation of the signal by current control circuit 112. Those of skill in the art will understand that it is easier to manipulate current than voltage. Examples of current manipulation can include filtering, shifting effective input control voltage range, and current sensitivity to input control voltage by adjusting the current to input control voltage slope characteristic.

The resulting current is then converted back to a corresponding voltage by current to voltage circuit 114, in preparation for the temperature dependency adjustment of the following circuit blocks. According to an alternate embodiment of the present invention, circuits 110, 112 and 114 can be omitted such that the input control voltage is coupled directly to voltage converter circuit 116.

The conditioned voltage from current to voltage circuit 114 is then processed by voltage converter circuit 116 to generate a voltage that is a function of temperature. To establish the temperature dependence of the resulting voltage, called a temperature compensated voltage, the PTAT circuit 118 is used. The PTAT circuit 118 generates a current that is proportional to temperature that is used by the voltage converter circuit 116 as a supply for its circuit components.

The temperature compensated voltage is then further conditioned by linearizer circuit 120 to generate gain signals V_GAIN+/V_GAIN−. In particular, linearizer circuit 120 adds a negative offset to the gain signals that will cancel a positive offset generated by the variable gain circuit 104, thus ensuring substantially linear operation that is independent of temperature.

DAC circuit 106, multiplexor 108, voltage to current converter 110, and current control circuit 112 are optional circuits for the presently described embodiments of the invention, but are also standard circuits known in the art. While current control circuit 112 may not be standardized, the various known circuit techniques can be used to manipulate the current as desired.

Figure 7:
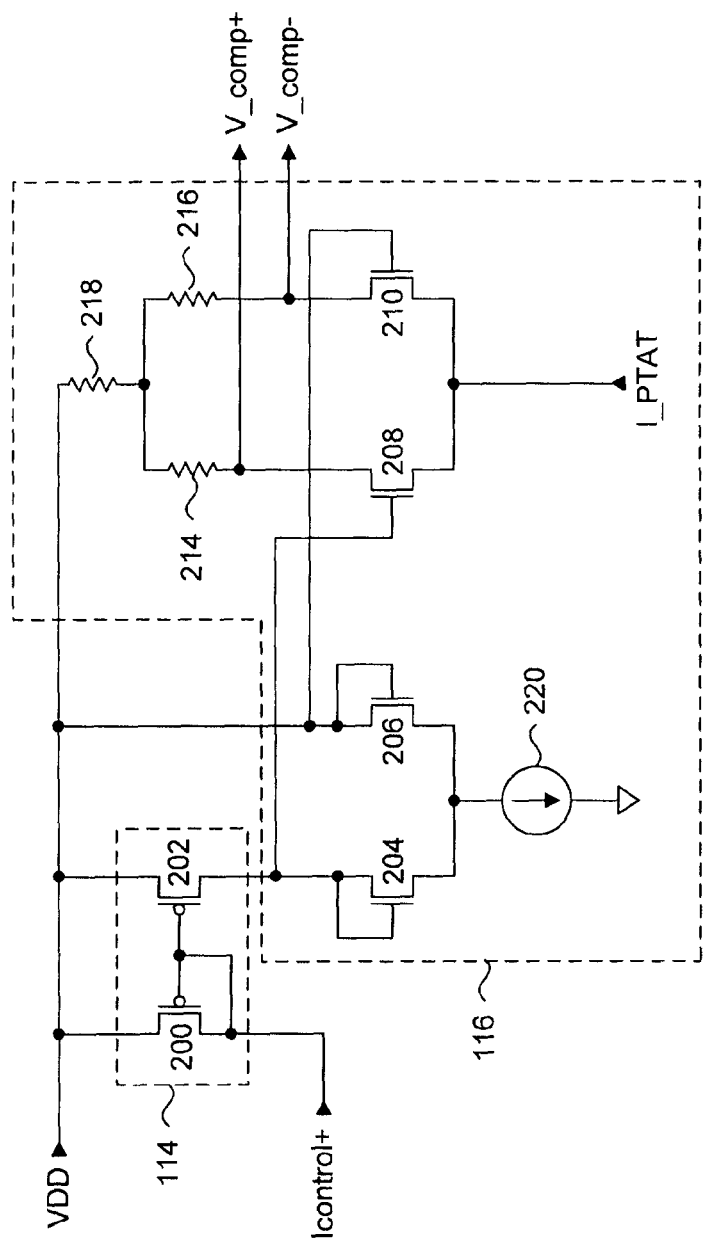
FIG. 7 is a circuit schematic of the voltage to voltage converter circuit shown in FIG. 6b, according to an embodiment of the present invention.

Following is a description of the voltage converter circuits 114 and 116, having a circuit configuration shown in FIG. 7. Voltage converter circuits 114 and 116 includes a current mirror pair consisting of p-channel transistors 200 and 202, diode connected n-channel transistors 204 and 206, and differential circuit consisting of n-channel transistors 208 and 210 coupled to load resistors 214, 216 and 218. Preferably, resistors 214, 216 and 218 are equal in value. Diode connected n-channel transistor 204 forms a current mirror pair with transistor 208, and similarly, diode connected n-channel transistor 206 forms a current mirror pair with transistor 210. The presently shown circuit is one example of a well known circuit that can be used for voltage converter circuits 114 and 116.

Transistor 200 has source/drain terminals connected between VDD and input control current Icontrol+ provided by voltage to current converter circuit 110, while transistors 202 and 204 are serially connected between VDD and current source 220. Transistor 206 has source/drain terminals connected to VDD and current source 220−. A common terminal of load resistors 214 and 216 is coupled to VDD via resistor 218, while the other terminal of load resistors 214 and 216 is connected to transistors 208 and 210 respectively. Temperature compensated voltage signals V_comp+/V_comp− are generated from the drain terminals of transistors 208 and 210, while their common source terminals are coupled to receive PTAT current.

In general operation, voltage converter 116 generates the temperature compensated voltage signals V_comp+/V_comp− from Icontrol+ by steering current differently through transistors 204 and 206 by virtue of the current mirror transistors 200 and 202 coupled to transistor 204. Accordingly, the gates of transistors 208 and 210 are biased differently, thereby tailoring the current through transistors 208 and 210. V_comp+ and V_comp− will then be set to different voltage levels. The temperature compensation circuit sets the current through transistors 208 and 210 via current I_PTAT.

Transistors 200, 202, 204 and 206 effectively function as a current to voltage converter, for converting Icontrol+ into two differential voltages V_COMP+ and V_COMP−. Then the differential pair circuit of transistors 208 and 210 effectively function as a current to voltage converter, for converting the currents into a differential voltage that is related to temperature.

Figure 8:
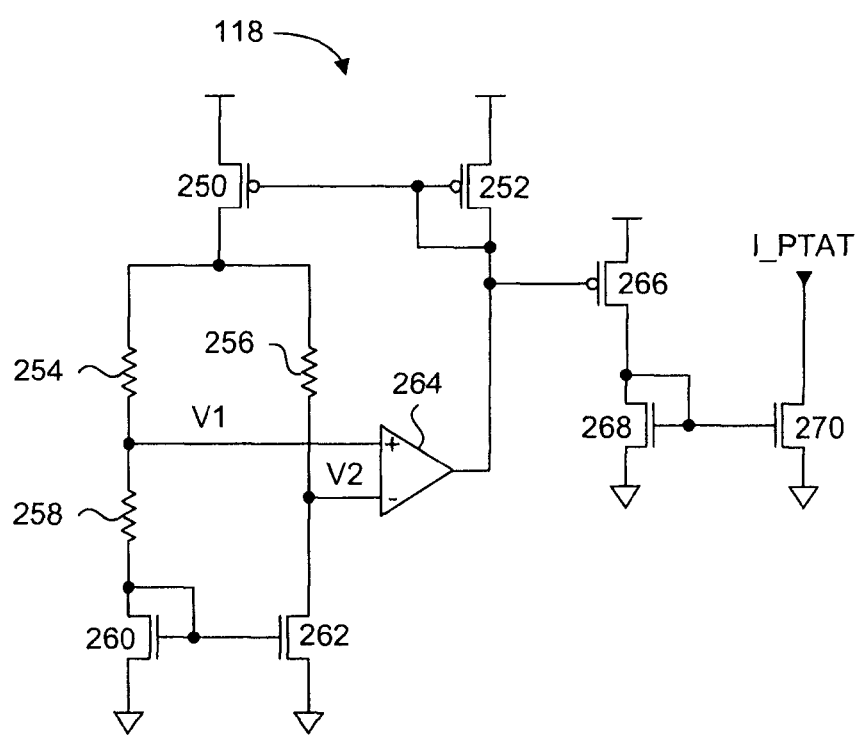
FIG. 8 is a circuit schematic of the PTAT circuit shown in FIG. 6b, according to an embodiment of the present invention.

Generating the current supply I_comp is the PTAT (proportional to absolute temperature) circuit 118. The PTAT circuit 118 shown in FIG. 8 includes p-channel transistors 250, 252, resistors 254, 256 and 258, n-channel transistors 260, 262, op-amp 264, p-channel transistor 266, and n-channel current mirror transistors 268 and 270. Transistors 250 and 252 are arranged in a current mirror configuration, and have their drain terminals connected to Vdd. Transistor 250 supplies current to a voltage divider network consisting of a pair of parallel voltage divider branches, where the first branch includes resistors 254, 258, and transistor 260 serially connected between the source terminal of transistor 250 and Vss. The second branch includes resistor 256 and transistor 262 serially connected between the source terminal of transistor 250 and Vss. Transistors 260 and 262 are arranged in a current mirror configuration and operate in the sub-threshold mode. Op-amp 264 has a positive input terminal connected to the common terminal of resistors 254 and 258 (node V1), and a negative/reference input terminal connected to the common terminal of resistor 256 and transistor 262 (node V2). The output of op-amp 264 is connected to the source of transistor 252 and to the gate of drive transistor 266. Drive transistor 266 has drain terminal connected to Vdd and a source terminal connected to diode connected transistor 268. Since transistors 268 and 270 are connected in a current mirror configuration, the current through transistor 270 will be the same as the current through transistor 268, provided they are similarly sized. This current is I_PTAT used in voltage converter circuit 116.

The aforementioned components of PTAT circuit 118 can be functionally grouped as follows. A voltage divider network consisting of the first and second voltage divider branches generates temperature dependent voltages V1 and V2, that may differ depending on the selected values for resistors 254, 256 and 258. Preferably, the ratio of the values of resistors 254 and 258 (254/258) is limited to 3 or 4, while the values of resistors 254 and 256 are equal to each other. These temperature dependent voltages are received by a current generator circuit consisting of op-amp 264, and transistors 250, 252 and 266. The voltage output of op-amp 264 will control the feedback current provided by controlled current source 250 to supply the voltage divider network, and the current provided by controlled current source 266. The voltage output of op-amp 264 is related to temperature, as are the currents provided by current sources 250 and 266.

In general operation, the values of resistors 254, 256 and 258 are selected to maintain transistors 260 and 262 in the sub-threshold region of operation, while op-amp 264 maintains V1=V2 through the feedback of its output to transistor 252, thereby controlling the current through transistor 250. Because transistors 260 and 262 are kept in the sub-threshold region of operation, they will exhibit the previously discussed exponential relationship between current and temperature. Therefore, the output current I_PTAT will be proportional to temperature.

Figure 9:
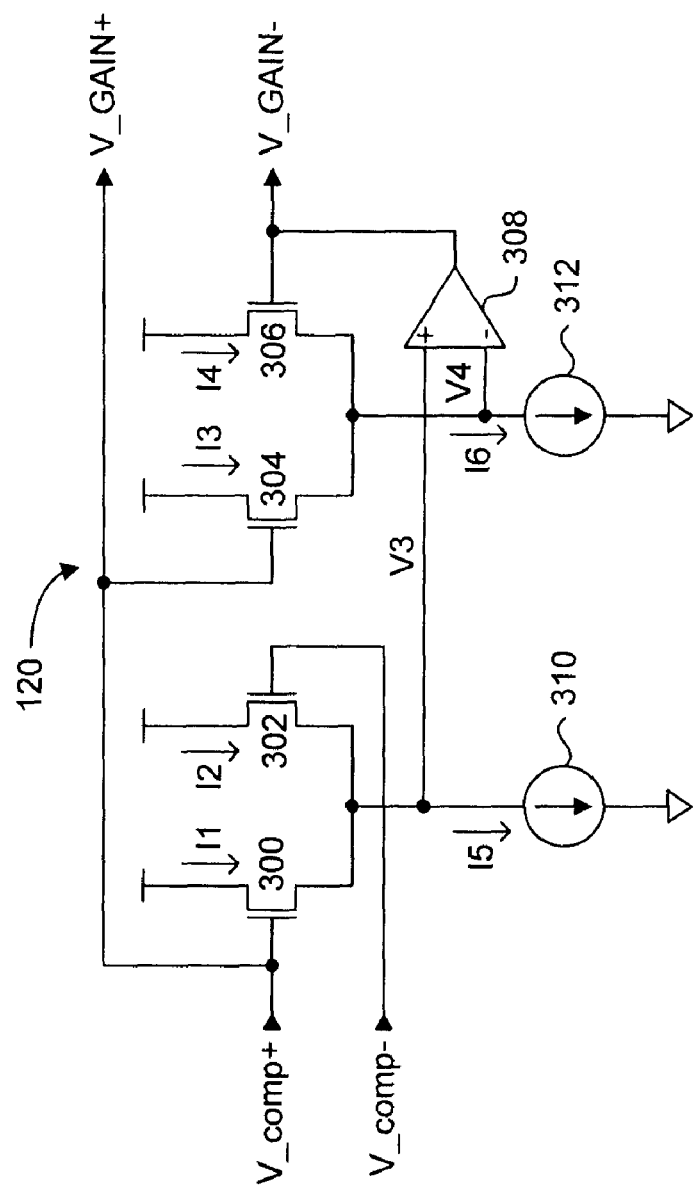
FIG. 9 is a circuit schematic of the linearizer circuit shown in FIG. 6b, according to an embodiment of the present invention.

FIG. 9 is a circuit schematic of the linearizer circuit 120 shown in FIG. 6b. Linearizer circuit 120 receives temperature compensated voltage signals V_comp+/V_comp−, and is responsible for pre-conditioning the signals such that control of the variable gain circuit is substantially linear. More specifically, the function of linearizer circuit 120 is to offset or cancel the "1" term in previously shown equation (3) for the variable gain circuit.

The linearizer circuit 120 includes n-channel transistors 300, 302, 304 and 306, op-amp circuit 308 and current sources 310 and 312. Transistors 300 and 302 form a first differential pair while transistors 304 and 306 form a second differential pair. The gates of transistors 300 and 304 receive V_comp+ and only the gate of transistor 302 receives V_comp−. The gate of transistor 306 receives the output of op-amp circuit 308, which is the output V_GAIN−. The input signal V_comp+ is simply re-labelled V_GAIN+ at the output. Op-amp circuit 308 has a positive input coupled to the common source terminals of transistors 300 and 302 (V3), and a reference input coupled to the common source terminals of transistors 304 and 306 (V4). The drain terminals of transistors 300, 302, 304 and 306 are connected to Vdd, and the current sources are connected to Vss. It is noted that the W/L size of transistors 300, 302 and 306 are the same, but the W/L size of transistor 304 is approximately 2W/L.

In general operation, transistors 300, 302, 304 and 306 operate in the sub-threshold region, and op-amp circuit maintains the voltage at node V4 equal to the voltage at node V3 by adjusting the gate voltage of transistor 306. The relationship of the output voltages V_GAIN relative to the input voltages V_comp is now described with reference to the equations (4) to (12) below. It is noted that the current through transistors 300, 302, 304 and 306 are denoted as currents I1, I2, I3 and I4 respectively, and the current through current sources 310 and 312 are denoted as currents I5 and I6 respectively. The gate-source voltage of transistors 300, 302, 304 and 306 are denoted Vgs1, Vgs2, Vgs3 and Vgs4 respectively.

$$I1+I2=I5 \quad (4)$$

$$I3+I4=I6 \quad (5)$$

where, $I1=\omega e^{Vgs1/\phi}$, $I2=\omega e^{Vgs2/\phi}$, $I3=2\omega e^{Vgs3/\phi}$, $I4=\omega e^{Vgs4/\phi}$, and Vgs1=Vgs3. where $\phi=kT/q$, where k=Boltzmann's constant, T=Temperature in Kelvin, and q=charge $$I1/I2=e^{V\_comp/\phi} \quad (6)$$

$$I3/I4=2e^{V\_GAIN/\phi} \quad (7)$$

From (4) and (6), expression (8) can be obtained.

$$I1=I5e^{V\_comp/\phi}/(1+e^{V\_comp/\phi}) \quad (8)$$

From (5) and (7), expression (9) can be obtained.

$$I4=(I6/2e^{-V\_GAIN/\phi})/(1+1/2\times e^{-V\_GAIN/\phi}) \quad (9)$$

$$\text{If } I1/I4=e^{V\_GAIN/\phi} \quad (10)$$

and substituting for I1 and I4 in (10) from equations (8) and (9) gives $$\frac{\left(\dfrac{Ie^{V\_comp/\phi}}{1+e^{V\_comp/\phi}}\right)}{\left(\dfrac{\dfrac{I}{2}e^{-V\_GAIN/\phi}}{1+\dfrac{1}{2}e^{-V\_GAIN/\phi}}\right)}=e^{V\_GAIN/\phi} \quad (11)$$

Alternatively, (11) can be summarized as (12) below:

$$\frac{1}{1+e^{-V\_comp/\phi}}=\frac{1}{2+e^{-V\_GAIN/\phi}} \quad (12)$$

where $V\_GAIN=\phi \ln(1+e^{V\_COMP/\phi})$, which is the same as equation (3).

The described gain system 100 of FIG. 6b will convert an analog input control voltage into a temperature compensated, linearized voltage for application to a variable gain amplifier circuit operating in the sub-threshold region. The temperature dependency of the variable gain amplifier circuit is compensated for by the PTAT circuit 118 such that gain is consistently the same for any given input control voltage, regardless of the operating temperature.

Figure 1:
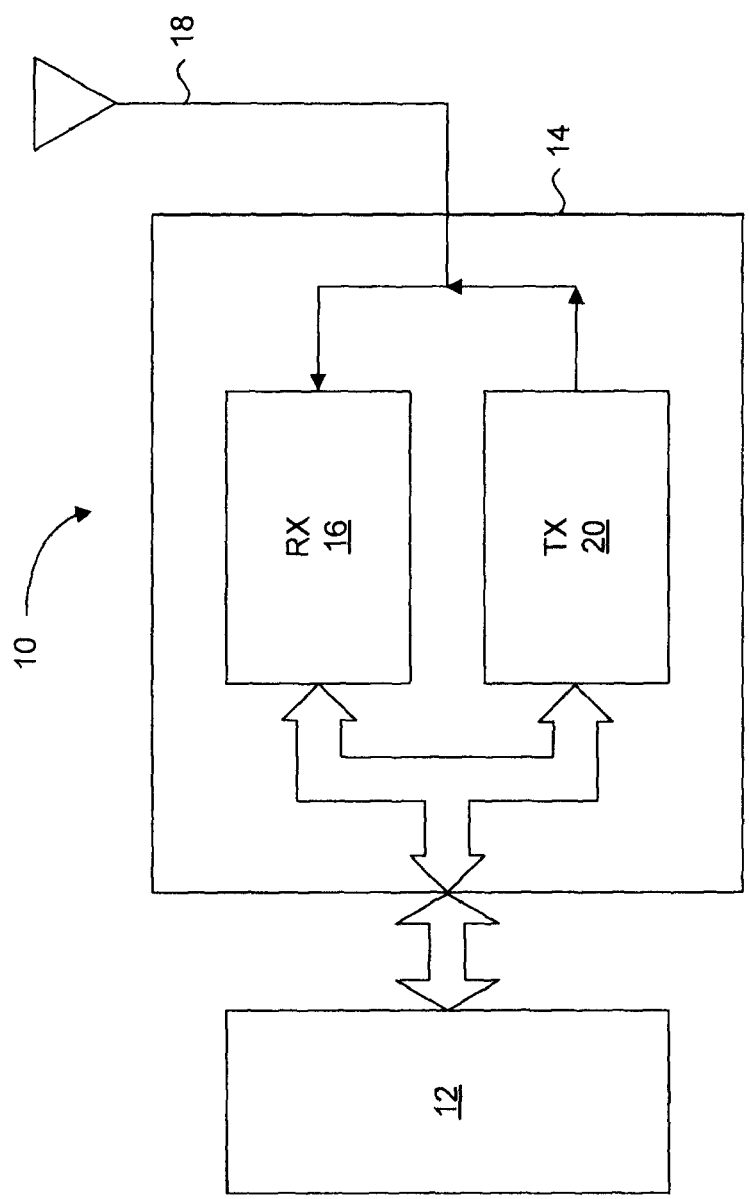
FIG. 1 is a block diagram of a wireless core of the prior art.
Figure 2:
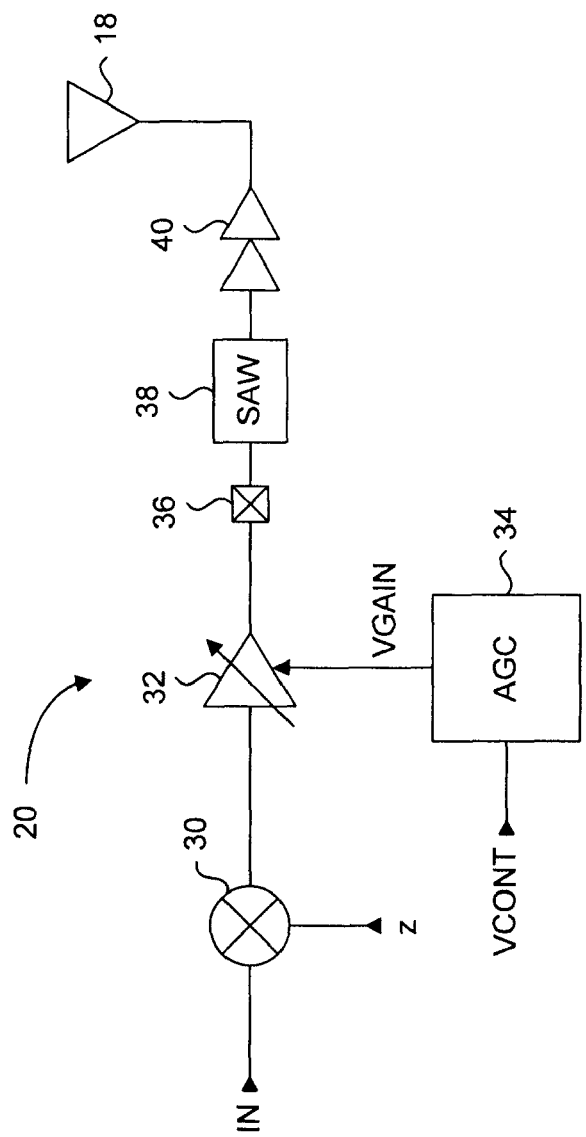
FIG. 2 is a block diagram of transmitter path circuits of the wireless core shown in FIG. 1.

As previously described, the noise introduced by the various voltage to current and current to voltage stages between the separate up conversion circuit 30 and variable gain circuit 32 of the prior art system shown in FIG. 2 can be reduced without the use of an external SAW filter. Because the variable gain circuit of the present invention is operated in the sub-threshold region, the up conversion circuit 30 and the variable gain circuit 32 can be merged together.

Figure 10:
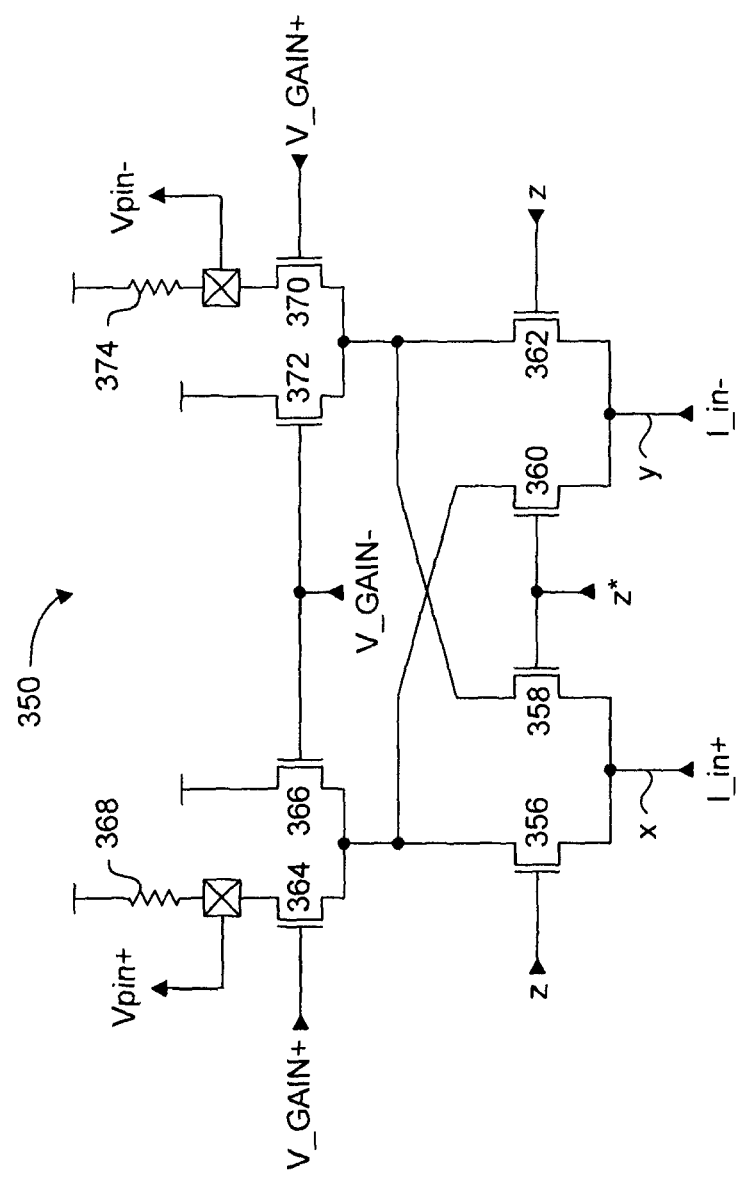
FIG. 10 is a circuit schematic of the merged mixer and VGA circuit shown in FIG. 6b, according to an embodiment of the present invention; and, FIG. 11 is a circuit schematic of a linear noise-inhibited current source circuit shown in FIG. 10, according to an embodiment of the present invention.

FIG. 10 is a circuit schematic of a merged up conversion, also known as a mixer, and variable gain amplifier circuit. This circuit will be referred to from this point forward as simply, a merged variable gain circuit. Merged variable gain circuit 350 includes two sub-circuits coupled in sequence. The first sub-circuit is a mixer section for multiplying the differential input currents I_in+/I_in− at nodes x and y with complementary frequency signals z/z*. Differential input currents I_in+/I_in− are generated from input signals IN/IN* shown in FIG. 6b. In the present application, the input voltage signals are upconverted to the frequency of the signals z/z*. The second sub-circuit is a variable gain section for amplifying the upconverted signals onto output pins by an amount of gain determined by the voltage level of gain control voltage V_GAIN+/V_GAIN−. Those of skill in the art will understand that two gain stages can be connected together to increase the total range of gain.

As previously mentioned, differential input currents I_in+/I_in− are generated from input signals IN/IN*. Preferably, I_in+ and I_in− are linear signals. As previously discussed, CMOS transistors are inherently non-linear devices. If left uncorrected, distortion of the input signal may result. Hence, the circuit responsible for generating I_in+ and I_in− preferably includes circuitry for compensating input signals IN and IN* to ensure a linear response is obtained from the n-channel transistors in response to input signals IN and IN*. A description of the circuit for generating I_in+ and I_in− follows later with reference to FIG. 11.

Figure 3:
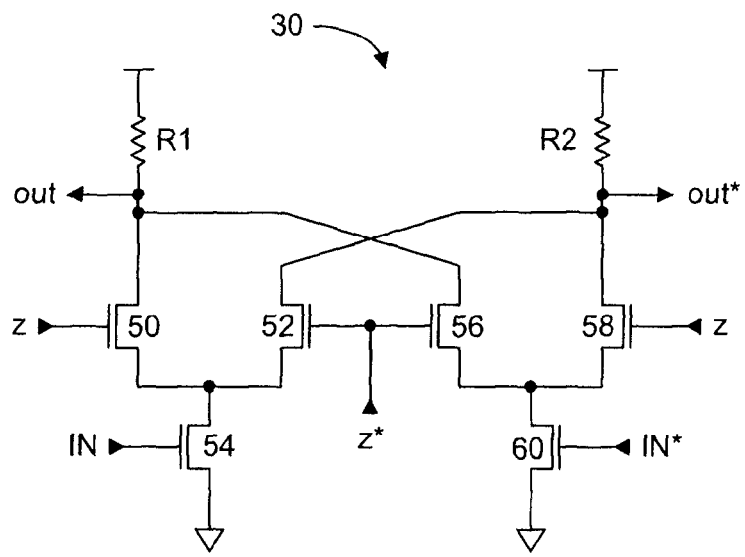
FIG. 3 is a circuit schematic of a CMOS mixer circuit of the prior art.

The first sub-circuit includes dual differential pairs similar to those shown in FIG. 3. The first differential pair includes n-channel transistors 356 and 358, while the second differential pair includes n-channel transistors 360 and 362. The gate terminals of transistors 356 and 362 receive signal z, while the gate terminals of transistors 358 and 360 receive the complement signal z*. The common source terminal of transistors 356 and 358 is coupled to I_in+, and the common source terminal of transistors 360 and 362 is coupled to I_in−. The drain terminal of transistors 356 and 360 are connected together, as are the drain terminals of transistors 358 and 362. The operation of this mixer circuit is similar to that of the circuit presented in FIG. 3.

The second sub-circuit is similar to the variable gain circuit shown in FIG. 4. The variable gain section includes two differential pair circuits. The first differential pair includes n-channel transistors 364 and 366, where transistor 364 is coupled to Vdd through load resistor 368, and transistor 366 is coupled directly to Vdd. The second differential pair includes n-channel transistors 370 and 372, where transistor 370 is coupled to Vdd through load resistor 374, and transistor 366 is coupled directly to Vdd. The gates of transistors 364 and 370 receive gain control voltage V_GAIN+, while the gates of transistors 366 and 372 receive gain control voltage V_GAIN−. The common source terminals of transistors 364 and 366 are connected to the common drain terminals of transistors 356 and 360. The common source terminals of transistors 370 and 372 are connected to the common drain terminals of transistors 358 and 362. The first differential pair drives output signal Vpin+ from an output pad coupled to load resistor 368, and the second differential pair drives opposite phase output signal Vpin− from another output pad coupled to load resistor 374. Transistors 364, 366, 372, 370, all operate in sub-threshold, therefore reducing the amount of head room required.

Merged variable gain circuit 350 minimizes the number of voltage to current and current to voltage conversion stages between receiving an input voltage signal, up converting the input voltage signal, and amplifying the unconverted signal. More specifically, once voltage input signals IN/IN* are converted to current through current source circuits 352 and 354, there is no further conversion of the current back to voltage until the output from the variable gain section. In contrast with the prior art unmerged mixer and variable gain circuits shown in FIGS. 3 and 4, two additional conversion stages are necessary. In FIG. 3, an additional current to voltage conversion stage is required to generate out and out*. In FIG. 4, an additional voltage to current conversion stage is required to generate current from out and out*. Therefore, with the merged variable gain circuit 350, any associated noise generated from these two extraneous conversion stages is removed.

As previously discussed for the first sub-circuit current source circuits 352 and 354, additional circuitry can be included to compensate for the non-linear behaviour of n-channel current source transistors. While effectively linearized, this additional circuitry will add noise to the compensated IN/IN* signals, which is undesirable. According to another embodiment of the present invention, the current source circuits 352 and 354 can include pre-filtering means for reducing this noise. In fact, the noise can be reduced to a level such that SAW filter 38 of FIG. 2 is no longer required.

Figure 11:
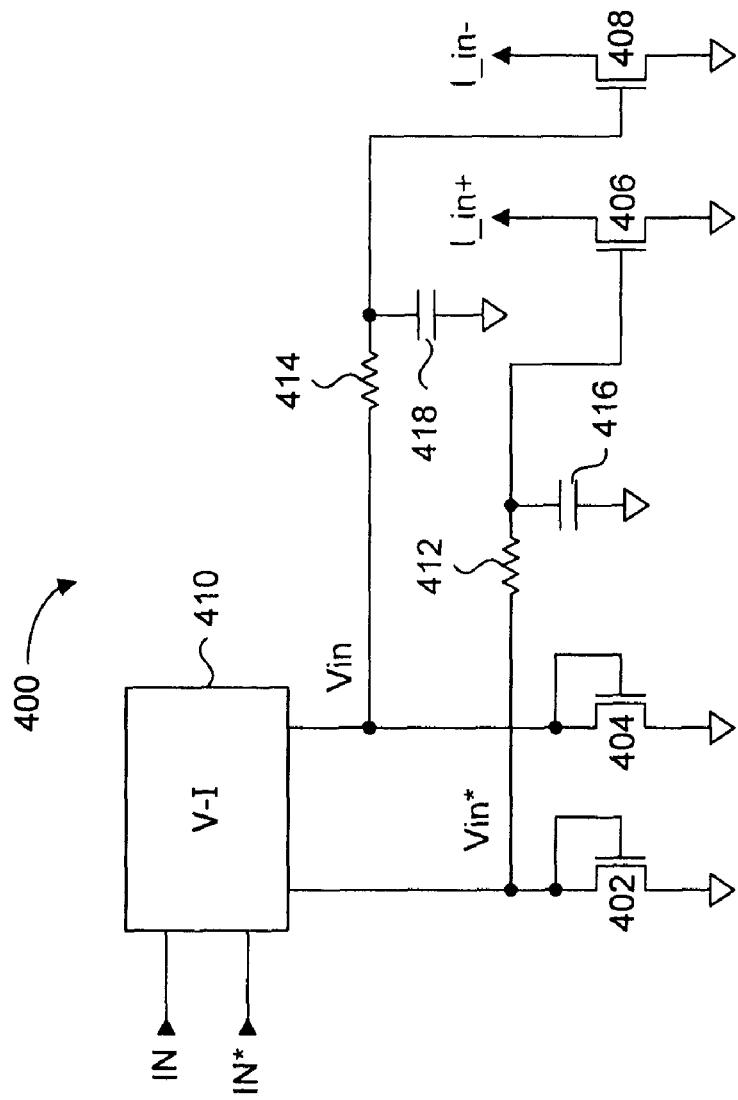

FIG. 11 is a circuit schematic of current source circuit for generating I_in+ and I_in−, according to an embodiment of the present invention. Current source circuit 400 includes n-channel transistors 402, 404, 406 and 408, V to I circuit 410, resistors 412, 414, and capacitors 416, 418. N-channel transistors 402, 404, 406, 408, resistors 412, 414, and capacitors 416, 418 form a noise reducing circuit. Linear correction circuit 410 receives the complementary baseband input signals IN/IN* and executes functions to maintain linearity going from V to I. The resulting voltage signals Vin and Vin* are provided to diode-connected transistors 402 and 404. Transistors 402 and 406 are arranged in a current mirror configuration, as are transistors 404 and 408. Transistors 406 and 408 are the drive transistors which generate signals I_in+ and I_in− respectively, for the merged variable gain circuit 350 of FIG. 10. Connected in-line between transistors 402 and 406 is resistor 412 and capacitor 416. Similarly, resistor 414 and capacitor 418 are connected in-line between transistors 404 and 408.

While transistors 402, 404, 406 and 408 are configured as current mirrors, functionally, transistors 402 and 404 behave as current to voltage converters for converting the outputs of linear correction circuit 410 to voltages Vin and Vin*. Transistors 406 and 408 behave as voltage to current converters for converting Vin and Vin* into corresponding currents for the merged variable gain circuit 350. The resistor-capacitor combination is effectively a low pass filter that reduces noise seen at the gate terminals of transistors 406 and 408.

The presently shown embodiment, and in particular the current mirror arrangement of transistors 402, 404, 406 and 408, provides several advantages. First, the current mirroring operation between transistors 402/406 and 404/408 is very linear, meaning that the current through either transistor 402 or 404 is substantially duplicated in respective mirroring transistors 406 and 408. Second, the sizing of transistors 406 and 408 can be scaled to increase their drive strength. For example, if transistor 402 has a unitary W/L size, mirroring transistor 406 can be scaled to 8×W/L. Third, the outputs of linear correction circuit 410 are decoupled from merged variable gain circuit 350. In the prior art, the linear correction circuit 410 outputs can be connected directly to nodes "a" and "b" of FIG. 10, without transistors 402, 404, 406 and 408, and the low pass filters.

The linear correction circuit 410 generates noise, and in the prior art configuration, this noise would propagate through to the outputs Vpin+/Vpin−. Although the low pass filter could be inserted in-line with the output of the linear correction circuit 410, the addition of a resistor would consume voltage headroom, resulting in distortion such as clipping of the signal.

Therefore, by having the low pass filters integrated with the current mirror configuration of the current source circuit 400, noise is reduced to a level where the addition of an external discrete SAW filter 38, or similar type of noise reducing circuit, is unnecessary. Therefore, the merged variable gain circuit 350 will generate even less noise if the presently shown embodiment of current source circuit 400 is used.

In summary, the embodiments of the previously described gain system provides a high range of gain, while ensuring substantially linear gain with respect to a gain control voltage. This substantially linear gain is attained by operating a CMOS variable gain circuit in the sub-threshold region, where its current then follows an exponential relationship with the applied gate source voltage. A PTAT circuit and linearizer circuit pre-condition the gain control signal to compensate for the temperature dependency of the variable gain circuit, and to offset the variable gain circuit. Because the variable gain circuit is operated in the sub-threshold region, it can be merged with the mixer/mixer circuit to minimize the number of intermediate current to voltage and voltage to current conversion stages. Further noise reduction can be realized by including a low pass filter within the input section of the merged mixer and variable gain circuit.

While the previously described embodiments will provide substantially linear gain with respect to a gain control voltage, there are additional factors that should be controlled, which can impact performance of the wireless device. The first factor is power consumption due to current levels used in the variable gain amplifier in the transmitter core. The second factor is the temperature effect on the output power, or gain profile of the variable gain amplifier. A constant high current level throughout the power output range will unnecessarily consume power and therefore reduce the battery life of mobile devices having wireless transmit circuits. A constant current at a high level should be used since linear operation at all output power levels will be substantially linear when a current corresponding to maximum power output is used. It has been found that different temperatures will change the gain of the variable gain amplifier, thereby changing the output power.

Accordingly, an adaptive current control circuit for reduced power consumption and minimized gain shift in a variable gain amplifier is provided. An automatic gain control circuit provides gain control voltages in response to a gain control signal. The gain control voltages are used by the variable gain amplifier to set the gain of the output signal for wireless transmit operations. The adaptive current control circuit receives the same gain control voltages for reducing current to the variable gain amplifier during low gain operation, while providing higher currents during high gain operation. The current that is provided is a hybrid mix of proportional to absolute temperature (PTAT) current and complementary to absolute temperature (CTAT) current for minimizing temperature effects on the gain. The ratio of PTAT current and CTAT current is adjustable for specific temperature ranges to further minimize temperature effects on the gain.

The power consumption issue, and embodiments for minimizing power consumption, will now be discussed. A discussion of the temperature-power output issue and embodiments for minimizing temperature dependency will follow later.

The popular application of wireless technology to mobile devices such as PDA's and mobile telephones means that the power source of the mobile device should be maximized for optimum user convenience. It is understood that at high transmit output power, current in the variable gain amplifier should be maximized in order to maintain linear operation with respect to the gain control voltage. However, at low output power less current is required to maintain linear operation.

Therefore, it is desirable to optimize the current provided to the variable gain amplifier in order to maintain linear operation while minimizing power consumption for the specific output power level.

Figure 12:
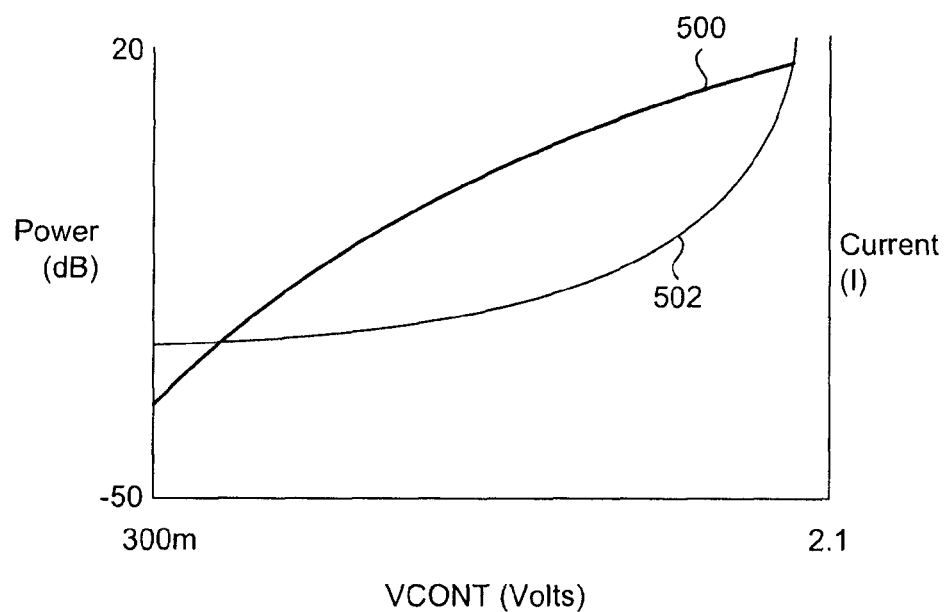
FIG. 12 is a an example plot of output power (dB) versus control voltage VCONT for setting the gain of a variable gain amplifier.

FIG. 12 is an example plot of output power (dB) versus the control voltage VCONT for setting the gain of a variable gain amplifier, presuming that the gain control circuits will provide a substantially linear relationship between actual gain and VCONT (Volts). FIG. 12 includes a power output curve 500 having a substantially linear relationship with VCONT, and a desired current profile curve 502 overlaid on the power output curve 500. As seen in current profile curve 502, the current for the variable gain amplifier drops at an exponential rate as VCONT is decreased to reduce the output power level. Eventually, the current decreases with a substantially linear and shallow slope as the output power is further reduced. While such optimized current to power schemes are known in the art, the implementations use significant additional circuits and elaborate feedback controls to sense the output power and adjust the current level accordingly. The additional circuits consume valuable chip area while the feedback controls introduce significant design overhead for the system, both of which directly contribute to cost of the gain system.

According to an embodiment of the present invention, a simple current control system is inserted into gain control path of the gain system for direct adjustment of the current of the variable gain amplifier with the desired gain. In otherwords, if the variable gain amplifier is controlled to provide maximum power, then the current control system provides a maximum current to the variable gain amplifier. On the other hand, if the variable gain amplifier is controlled to provide minimum power, then the current control system provides a minimum current, which is sufficient to maintain linear operation of the variable gain amplifier.

Figure 13:
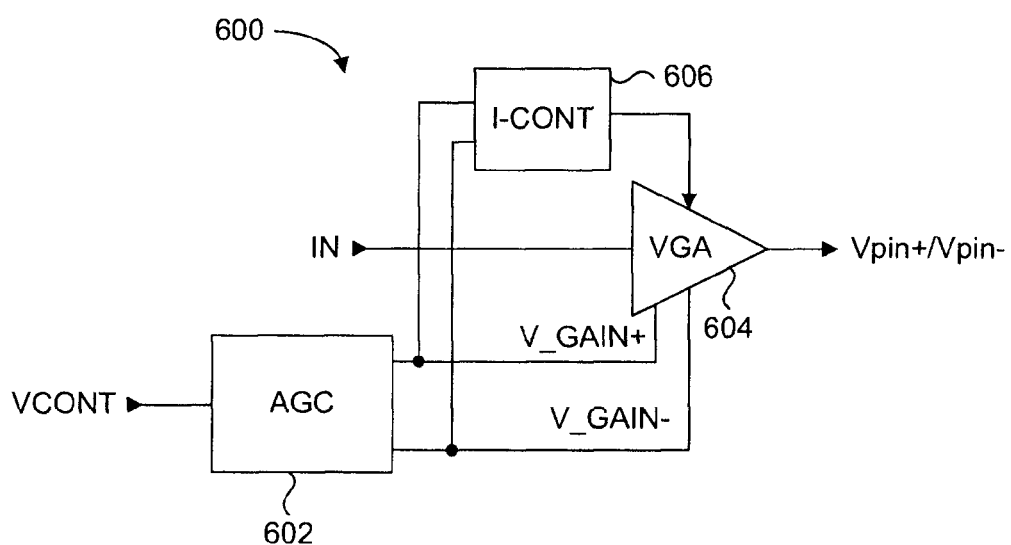
FIG. 13 is a block diagram of a gain system with integrated adjustable current control, according to an embodiment of the present invention.

FIG. 13 is a block diagram illustrating a gain system with integrated adjustable current control, according to an embodiment of the present invention. The gain system 600 includes an automatic gain controller 602, a variable gain amplifier 604, and a current control circuit 606. The automatic gain controller 602 can be implemented with any type of gain control circuit that provides differential gain control voltages having a linear relationship with the control voltage VCONT, for linear operation of the variable gain amplifier 604. In the present example embodiment, automatic gain controller 602 can be implemented with the previously described embodiments of the gain control circuit 102 of FIG. 6b. The variable gain amplifier can be implemented with any type of VGA circuit, such as merged variable gain circuit 350 of FIG. 10. Alternately, a combination of an upconversion circuit 30 or mixer of FIG. 3 and variable gain circuit 32 of FIG. 4 can be used instead.

The differential gain control voltages V_GAIN− and V_GAIN+ provided by the automatic gain controller 602 are provided to the variable gain amplifier 604 as in the previously shown embodiments of the gain system. To effect current control, the same differential gain control voltages V_GAIN− and V_GAIN+ are provided to current control circuit 606, which then adjusts the current used by variable gain amplifier 604. An advantage provided by gain system 600 is the absence of a complex feedback loop for monitoring the output power of the variable gain amplifier 604. Instead, the present embodiment takes advantage of the differential gain control voltages generated by the automatic gain controller 602, which are already configured to linearly adjust gain of variable gain amplifier 604. The additional circuits of current control circuit 606 are minimal.

Figure 14:
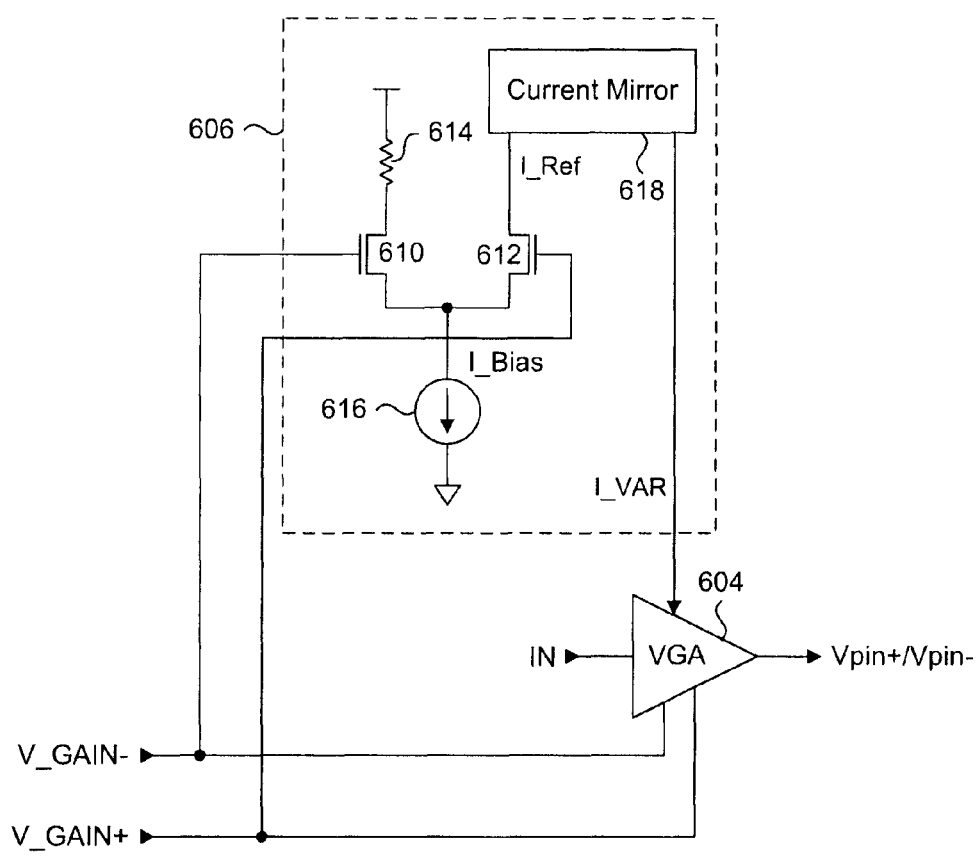
FIG. 14 a circuit schematic of the current control circuit of FIG. 13, according to an embodiment of the present invention.

FIG. 14 is a circuit schematic showing further details of the current control circuit 606 of FIG. 13, according to an embodiment of the present invention. The current control circuit 606 includes two main circuit components. The first component is a current steering circuit consisting of differential input n-channel transistors 610 and 612, a load element 614 and a constant-gm current source 616. The load element 614 is implemented as a resistor in the present example embodiment. In the current steering circuit, the differential input n-channel transistors 610 and 612 are connected in parallel with each other at a common node, and each transistor forms part of a current branch. The current through input transistor 612 is a reference current I_Ref provided to the current mirror circuit 618. The constant-gm current source 616 is connected to the common node for providing a bias current I_Bias. Therefore depending on the voltage levels of V_GAIN− and V_GAIN+, the reference current through input transistor 612 will be $\alpha$I_Bias, where $\alpha$ is a weighting factor between a predetermined minimum value and 1. Accordingly, the current through the branch including input transistor 610 will be $(1-\alpha)$I_Bias.

The second component is a standard current mirror circuit 618, which is well known in the art. The current mirror circuit 618 receives the reference current from input transistor 612 and generates a variable current I_VAR for the variable gain amplifier 604. For the present example, it is assumed that the transistor elements of current mirror circuit are sized such that the magnitude of I_VAR corresponds to that of I_Ref.

Figure 15:
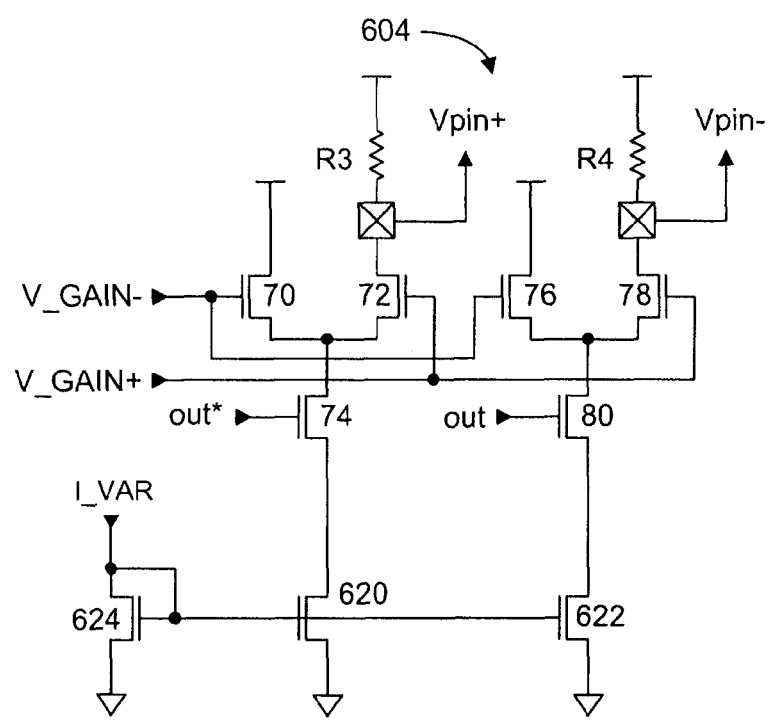
FIG. 15 is an example circuit implementation of the variable gain amplifier of FIG. 13.

FIG. 15 is an example circuit implementation of variable gain amplifier 604. The variable gain amplifier circuit 604 of FIG. 15 is substantially identical to the variable gain amplifier 32 shown in FIG. 4, and therefore uses the same reference numerals to identify the circuit elements shown therein. The variable gain amplifier 604 includes two differential amplification stages, where the first includes transistors 70 and 72 and the second includes transistors 76 and 78, and an input stage including transistors 74 and 80. The minor modification made to the circuit of FIG. 4 is that the source terminals of n-channel transistors 74 and 80 are now coupled to additional n-channel mirror transistors 620 and 622. Also included is diode-connected n-channel transistor 624 connected between I_VAR and VSS, in a current mirror configuration with mirror transistors 620 and 622. Assuming that 620, 622 and 624 are identically sized, I_VAR generated in FIG. 14 will be mirrored in transistors 620 and 622.

The basic operation of the circuits of FIGS. 14 and 15 is now described for the maximum gain setting and the minimum gain setting. In the maximum gain setting, V_GAIN+ will be at a maximum corresponding voltage supply level while V_GAIN− will be at a minimum voltage level. Therefore in FIG. 14, input transistor 6110 will be substantially turned off while input transistor 612 wilt be fully turned on, thereby providing I_Ref=I_Bias as weighting factor $\alpha$ is 1. In the variable gain circuit 604 of FIG. 15. V_GAIN+ at the maximum corresponding voltage supply level will fully turn on transistors 72 and 78 to maximize the current and power of output signals Vpin+ and Vpin−, while transistors 70 and 76 are substantially turned off. In the minimum gain setting on the other hand, V_GAIN+ will be at a minimum corresponding voltage supply level while V_GAIN− will be at a maximum voltage level. Accordingly I_Ref=$\alpha$I_Bias, where $\alpha$ is at the predetermined minimum level. Therefore I_Ref is at a minimum level. In the variable gain circuit 604 of FIG. 15, V_GAIN+ at the minimum corresponding voltage supply level will substantially turn off transistors 72 and 78 to minimize the current and power of output signals Vpin+ and Vpin−.

Therefore, since the current control circuit 606 steers current in response to the same gain control signals received by the variable gain amplifier 604, the power and current of the variable gain amplifier 604 can be controlled at the same time. The previously described embodiments of the gain system now control gain linearly and control the current to reduce the power consumption at lower power levels. Such a gain system is effective for applications where temperature variation is limited. However, in applications where the ambient temperature of the device incorporating the previously described embodiments of the invention can vary significantly, it has been noted that the output power from the transmit circuit will vary. For example, mobile consumer products can be subjected to cold temperatures in winter environments and hot temperatures in summer environments. Unfortunately, the power output characteristics of the gain system, and in particular the variable gain amplifier, will change with temperature.

Figure 16:
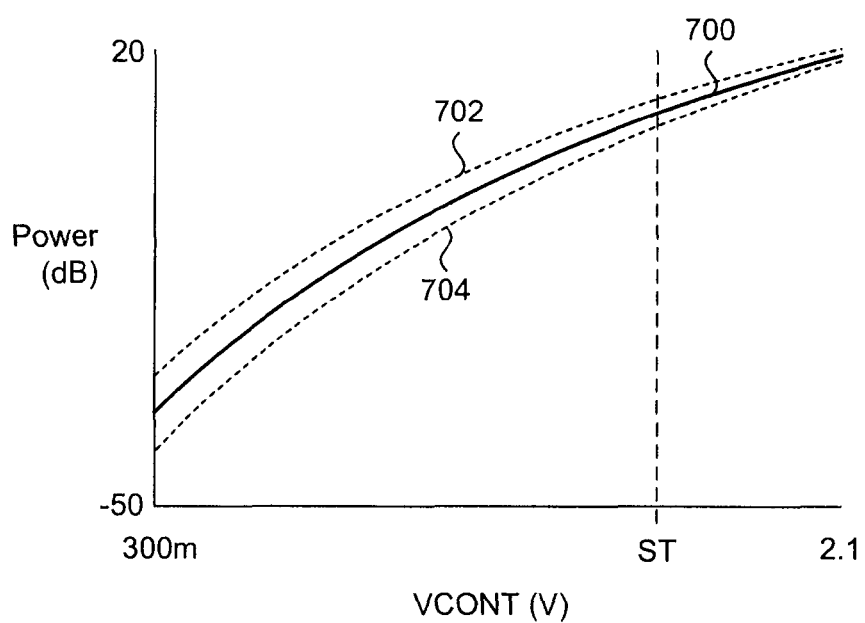
FIG. 16 is an example plot of output power (dB) versus control voltage VCONT illustrating gain shift with temperature.

FIG. 16 is the example plot of output power (dB) versus the control voltage VCONT shown earlier in FIG. 12. A power output curve 700 is plotted, which corresponds to power output curve 500 is shown in FIG. 16. It has been discovered that a variance in temperature will change the power output characteristics of the variable gain amplifier of the gain system. Power output curve 702 is an example of the variable gain amplifier operating under low temperature, or a temperature lower than the operating conditions for producing power output curve 700. Power output curve 704 is an example of the variable gain amplifier operating under high temperature, or a temperature higher than the operating conditions for producing power output curve 700. Both power output curves 702 and 704 are effectively shifted relative to the power output curve 700 in response to the extreme temperatures.

It should be noted that the shift is not constant, and the shift is less pronounced at the higher power output levels, while it is more pronounced at lower power output levels. At low power output levels, the circuits of the previously described embodiments are operating fully in the sub-threshold region. At higher power output levels, the circuit is operating at the limits of the sub-threshold region, meaning that the transistors are about to exit the sub-threshold operating region. In such conditions, it is hypothesized that the effects of temperature will affect the transistor devices differently. In otherwords, transistor devices operating in the full sub-threshold region (ie. Low power output) may be more sensitive to temperature changes than transistor devices operating at the limits of the sub-threshold region (ie. High power output). A dashed vertical line marked "ST" illustrates a theoretical point sub-threshold transition point where temperature sensitivity of the transistor devices changes. The true position can be determined through experimental analysis or simulation of a gain system under extreme temperature conditions.

The main reason for this effect is the use of constant-gm biasing of the variable gain amplifier. For example, current steering circuit of FIG. 14 employs a constant-gm current source 616 that is typically implemented as a PTAT circuit such that a temperature increases, the current is increased in order to maintain a constant gm. The PTAT circuit provides good gain control, but poor linearity at lower temperature operation as insufficient current is provided. The current source 616 could be implemented as a complementary to absolute temperature (CTAT) circuit which provides a current that is substantially independent of temperature and thereby considered constant. Unfortunately, there is poor gain variation when a CTAT circuit is used to generate I_Bias.

Figure 17:
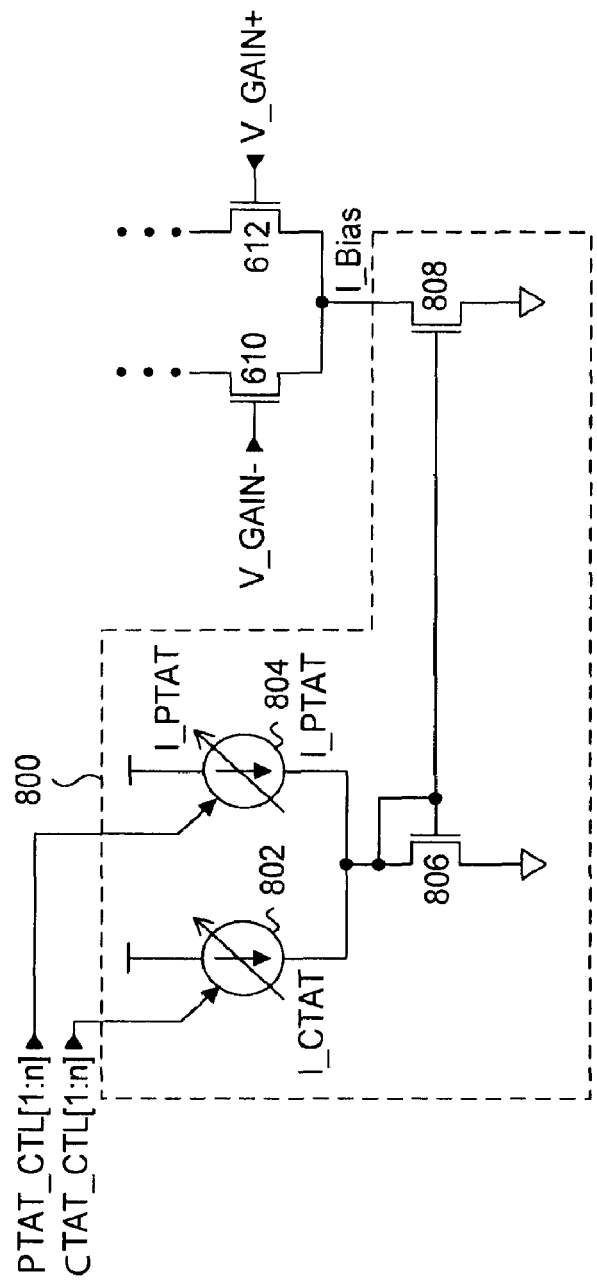
FIG. 17 is a conceptual illustration of a hybrid current source, according to another embodiment of the present invention.

Therefore, to minimize the temperature effect while maintaining good gain control and linearity, a combination of a PTAT current source and a CTAT current source are used to generate the bias current I_Bias. FIG. 17 is a conceptual illustration of a hybrid current source for the current control circuit 606 of FIG. 14, according to another embodiment of the present invention. FIG. 17 shows a portion of the current steering circuit of FIG. 14, in particular the differential input n-channel transistors 610 and 612, and the hybrid current source 800. In this conceptual embodiment, hybrid current source 800 includes a CTAT current source 802, a PTAT current source 804, a diode-connected n-channel transistor 806 and an n-channel mirror transistor 808.

The current sources 802 and 804 are configurable in response to control signals CTAT_CTL[1:n] and PTAT_CTL[1:n], where n is an integer value greater than 1, such that the ratio of CTAT current I_CTAT to PTAT current I_PTAT can be varied to optimize the gain variation with temperature over the power gain range. For example, the ratio can be set to be approximately unity, meaning that half the biasing current is from the PTAT current source 804 and the other half is from the CTAT current source 804. In operation, the I_CTAT current from CTAT current source 802 and the I_PTAT current from PTAT current source 804 are effectively summed together in diode-connected transistor 806. Mirroring transistor 808, being sized the same as transistor 806 will generate the same summed current for I_Bias. In the present embodiment, CTAT_CTL[1:n] and PTAT_CTL[1:n] are digital signals.

The hybrid current source 800 of FIG. 17 can have the ratio of CTAT and PTAT current statically preset to optimize gain variation, meaning to minimize the gain variation across the entire range of power gain. This can depend on several parameters, such as the semiconductor manufacturing technology and supply voltage level, for example. The optimal ratio can be determined through experimentation and the current sources can be programmed via programmable registers or fuses to provide the desired contribution of current. Control signals CTAT_CTL[1:n] and PTAT_CTL[1:n] will therefore be calibrated to control their respective current sources in response to the data stored in the aforementioned registers or fuses.

Figure 18B:
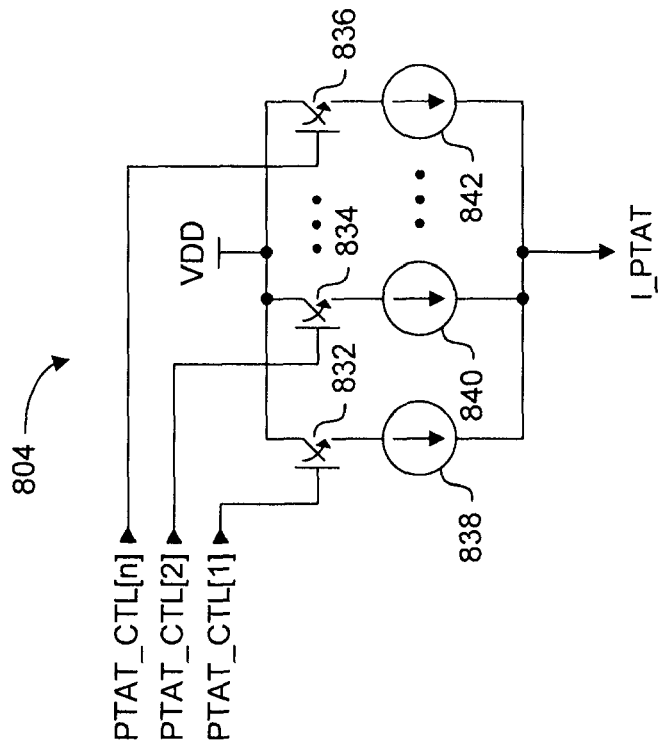
FIG. 18b is a circuit schematic showing details of the adjustable PTAT current source of FIG. 17.
Figure 18A:
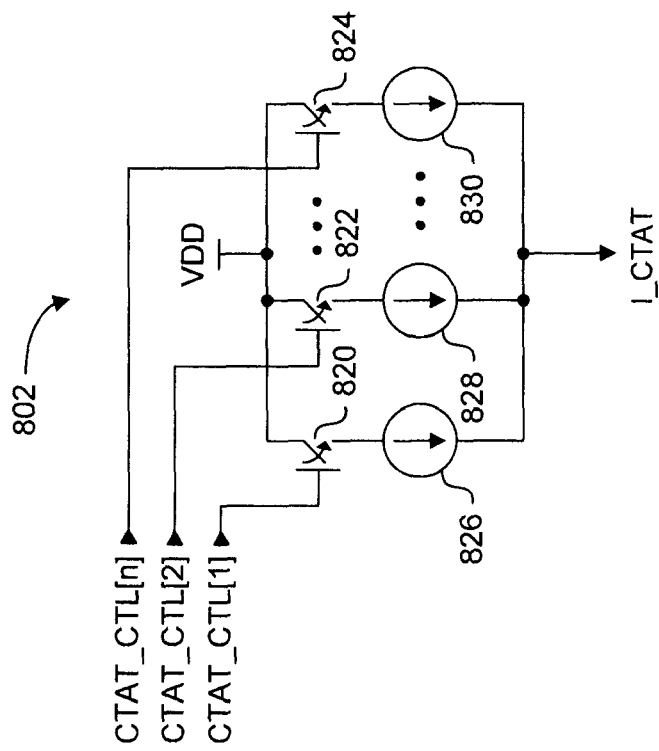
FIG. 18a is a circuit schematic showing details of the adjustable CTAT current source of FIG. 17.

FIG. 18a is a circuit schematic showing details of the adjustable CTAT current source 802 of FIG. 17. Adjustable current source 802 includes a switch circuit consisting of switch elements 820, 822 and 824, each connected in series with corresponding CTAT current source 826, 828 and 830. Each CTAT current source can be configured to provide a specific amount of current. For example, each CTAT current source can be binary weighted or temperature weighted. Accordingly, the switch elements 820, 822 and 824 will selectively couple a combination of one or more current sources 826, 828 and 830 to VDD in response to digital control signals CTAT_CTL[1], CTAT_CTL[2] and CTAT_CTL[n], thereby changing the magnitude of I_CTAT.

FIG. 18b is a circuit schematic showing details of the adjustable PTAT current source 804 of FIG. 17. Adjustable current source 804 includes a switch circuit consisting of switch elements 832, 834 and 836, each connected in series with corresponding PTAT current source 838, 840 and 842. Each PTAT current source can be configured to provide a specific amount of current. For example, each PTAT current source can be binary weighted or temperature weighted. Accordingly, the switch elements 832, 834 and 836 will selectively couple a combination of one or more current sources 838, 840 and 842 to VDD in response to digital control signals PTAT_CTL[1], PTAT_CTL[2] and PTAT_CTL[n], thereby the magnitude of I_PTAT.

The previous embodiment employs static setting of the PTAT and CTAT current source ratio using CTAT_CTL[1:n] and PTAT_CTL[1:n]. Therefore, CTAT_CTL[1:n] and PTAT_CTL[1:n] can be referred to as ratio control words, which can be permanently set by fuse programming, or other non-volatile storage means. Alternately, these ration control words can be provided by registers that are loaded with the appropriate data by the base band processor each time the wireless device is powered up. Improved control over the gain variation across the power gain range can be provided through dynamic setting of the ratio. For example, since the variable gain amplifier operating in the sub-threshold region at low power is more sensitive to temperature variation, a higher proportion of CTAT current should be provided. This means that CTAT current would dominate the I_Bias current provided to the variable gain amplifier. On the other hand, at the higher power output level where the variable gain amplifier is less sensitive to temperature variation, a higher proportion of PTAT current should be provided. This means that PTAT current would dominate the I_Bias current to provide good gain control at the high power levels. To enable dynamic setting of the CTAT and PTAT current ratio, the configuration circuit can use temperature information to determine which setting to use.

Figure 19:
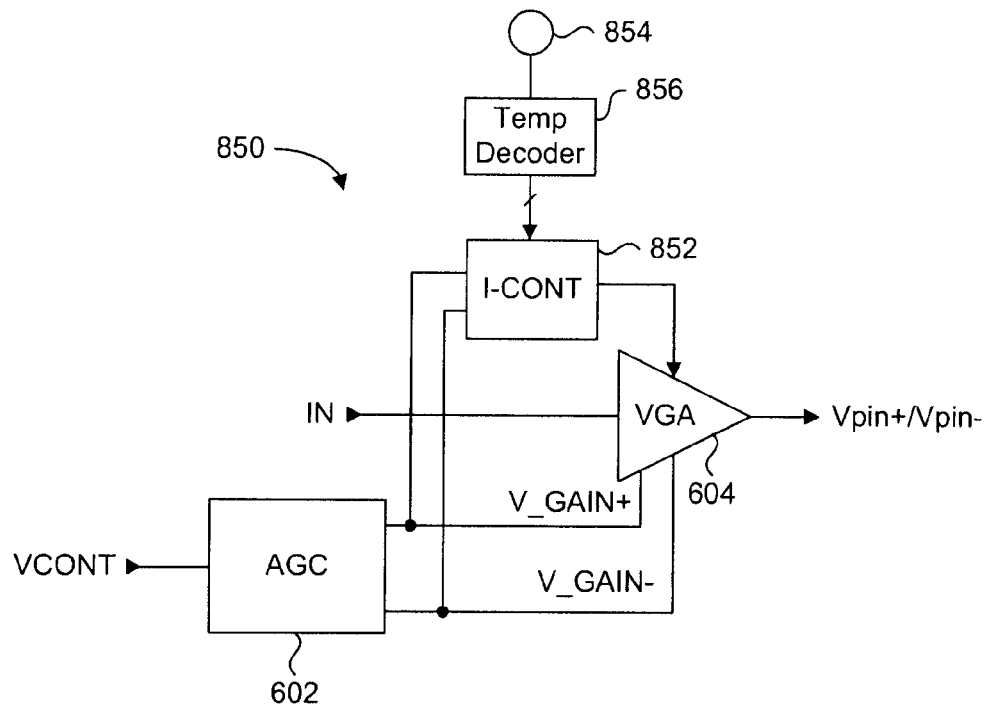
FIG. 19 is a block diagram of a gain system with integrated adjustable current control responsive to temperature, according to an embodiment of the present invention.

FIG. 19 is a block diagram of a gain system with a temperature feedback loop for dynamic adjustment of the CTAT and PTAT current ratio, according to an embodiment of the present invention. Gain system 850 includes the same automatic gain controller 602 and variable gain amplifier 604 shown in the previous embodiments, but now includes a temperature dependent current control circuit 852, a temperature sensor 854 and a temperature decoder 856. The temperature dependent current control circuit 852 can include previously disclosed hybrid current source 800 of FIGS. 17, 18a and 18b respectively. The temperature sensor 854 can be any means that will generate a current or voltage corresponding to a temperature. It is noted that many mobile devices already have temperature sensors integrated into the device package for monitoring temperature. Hence this temperature sensor can be further coupled to the temperature decoder 856. The temperature decoder 856 will be configured to generate different ratio control words for the PTAT and CTAT current sources. In one embodiment, a sensed temperature within a specific temperature range will provide the same ratio control words, where there can be two or more specific temperature ranges.

Figure 20:
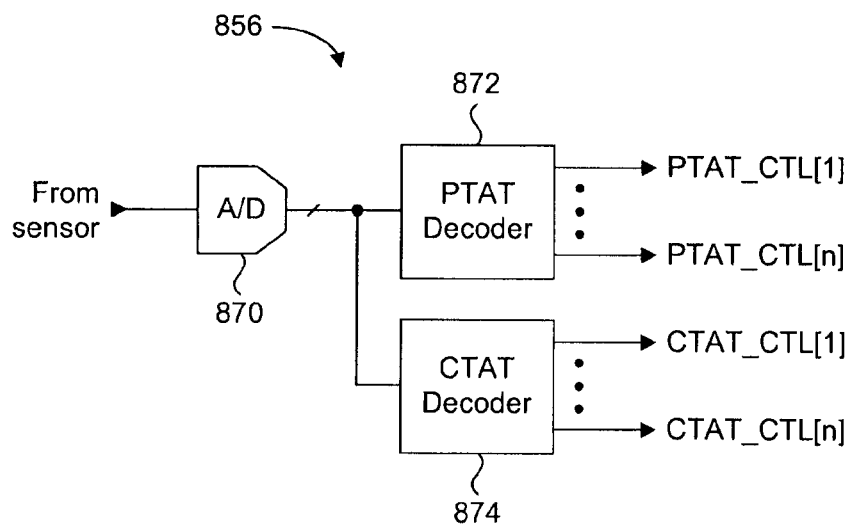
FIG. 20 is a block diagram of the temperature decoder of FIG. 19.

FIG. 20 is a block diagram illustrating an example implementation of the temperature decoder 856 of FIG. 19. The temperature decoder 856 includes an analog to digital (A/D) converter 870 for converting an analog signal corresponding to a temperature sensed by temperature sensor 854 into a digital output signal. Depending on the implementation, the A/D converter 870 can be integrated with the temperature sensor 854 instead. The resolution of the A/D converter 870 can be predetermined based on desired design parameters. The digital output signal is provided in parallel to a PTAT decoder 872 and a CTAT decoder 874. Each decoder is designed to decode the digital output signal differently, in order to generate a first ratio control word PTAT_CTL[1:n] and a second ratio control word CTAT_CTL[1:n]. More specifically, decoders 872 and 874 are configured with decoding logic specific for generating a pair of ratio control words for each predetermined temperature range. While not shown in FIG. 20, registers can be used to hold the logic states of PTAT_CTL[1:n] and CTAT_CTL[1:n].

As previously discussed, each pair of ratio control words sets the ratio of PTAT current and CTAT current that make up the I_Bias current. For example, any sensed temperature between 80 to 100 degrees Celsius results in different digital output signals from A/D converter 870. However, decoders 872 and 874 will be configured to generate the same pair of ratio control words for the different digital output signals of the temperature range. In otherwords, temperature decoder 856 bins the sensed temperatures into predetermined ranges. Those skilled in the art will understand that different A/D conversion and decoding schemes can be used with equal effectiveness.

The temperature can be sensed on a regular basis to update the ratio control words stored in registers 821 and 822 of FIG. 18, as required. This can be after a specific time duration, such as every 10 minutes for example. Alternately, the temperature can be sensed in response to specific actions, such as upon power up of the device or exit from a sleep mode of operation, since it is likely that the transmit functionality of the wireless device will be used. Naturally, combinations of action based triggers and time based triggers can be employed for sensing the temperature.

Figure 21:
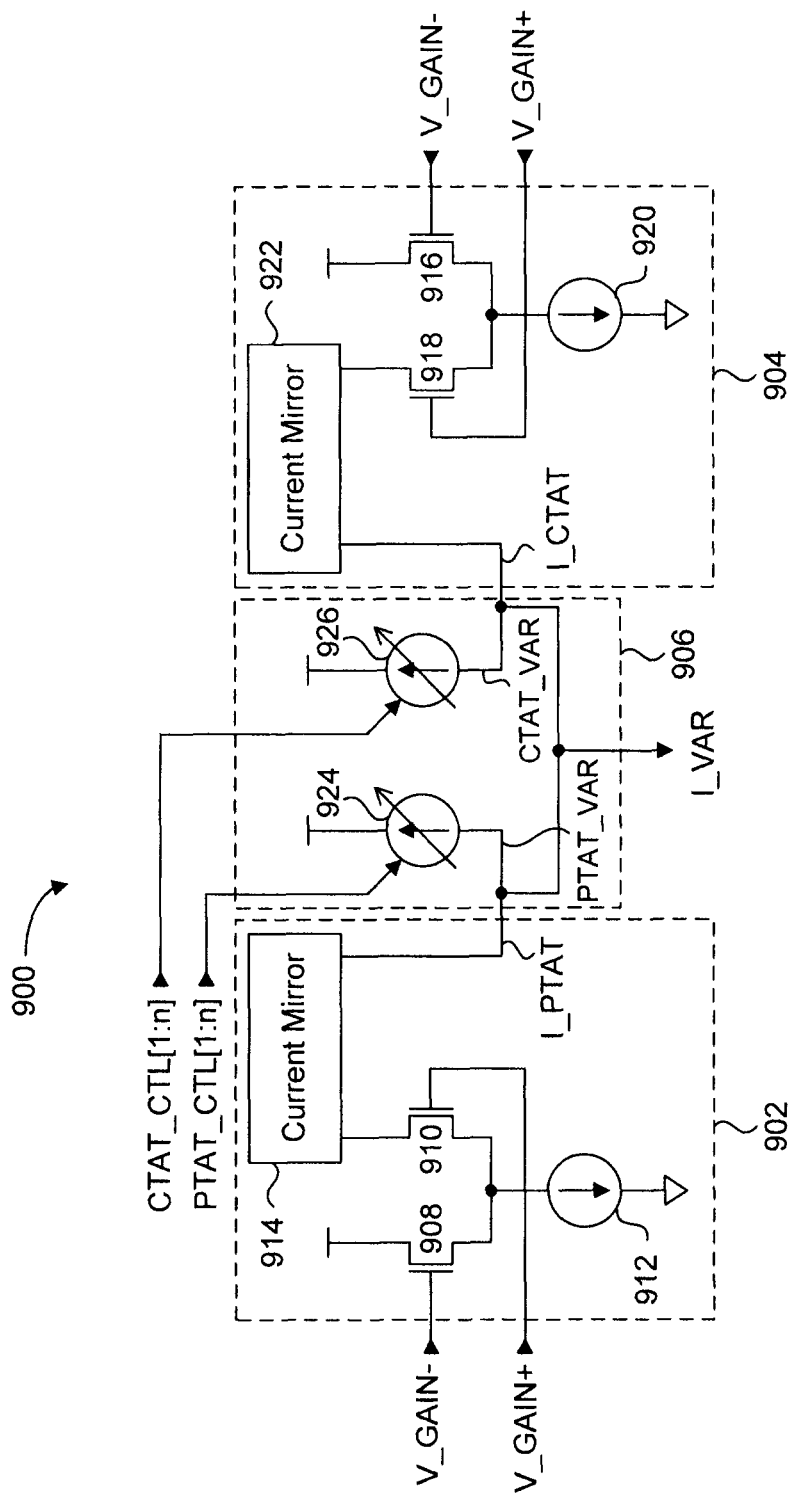
FIG. 21 is a circuit schematic of the temperature dependent current control circuit of FIG. 19.

FIG. 21 is an implementation embodiment of temperature dependent current control circuit 852 shown in FIG. 19. Temperature dependent current control circuit 900 includes a PTAT current steering circuit 902, a CTAT current steering circuit 904, and a current weighting circuit 906. The two steering circuits 902 and 904 perform the same function as the current control circuit 606 of FIG. 14, but for respective PTAT and CTAT current sources. The current weighting circuit 906 receives reference currents I_CTAT and I_PTAT from the two steering circuits 902 and 904, and sets the proportion of each that makes up bias current I_Bias in response to ratio control words CTAT_CTL[1:n] and PTAT_CTL[1:n]. A further discussion of circuits 902, 904 and 906 follows.

PTAT current steering circuit 902 includes differential input n-channel transistors 908 and 910 and a PTAT current source 912. In the PTAT current steering circuit 902, the differential input n-channel transistors 908 and 910 are connected in parallel with each other at a common node, and each transistor forms part of a current branch. The current through input transistor 910 is reference current I_PTAT provided to the current mirror circuit 914. Input transistor 908 is controlled by V_GAIN− while input transistor 910 is controlled by V_GAIN+. CTAT current steering circuit 904 is similarly configured to PTAT current steering circuit 902. CTAT current steering circuit 904 includes differential input n-channel transistors 916 and 918 and a CTAT current source 920. In the CTAT current steering circuit 904, the differential input n-channel transistors 916 and 918 are connected in parallel with each other at a common node, and each transistor forms part of a current branch. The current through input transistor 918 is reference current I_CTAT provided to the current mirror circuit 922. Input transistor 916 is controlled by V_GAIN− while input transistor 918 is controlled by V_GAIN+. Both PTAT current steering circuit 902 and CTAT current steering circuit 904 will operate independently of each other in response to V_GAIN− and V_GAIN+.

The current weighting circuit 906 includes a first adjustable current source 924 connected to VDD and in parallel with reference current I_PTAT, and a second adjustable current source 926 connected to VDD and in parallel with reference current I_CTAT. The first adjustable current source 924 is controlled by ratio control word PTAT_CTL[1:n] while the second adjustable current source 926 is controlled by ratio control word PTAT_CTL[1:n]. Adjustable current sources 924 and 926 can be implemented with the circuit shown in FIGS. 18a and 18b, except that their current outputs are now referred to as PTAT_VAR and CTAT_VAR respectively.

Because both adjustable current sources 924 and 926 are connected to VDD, they can each add supplemental currents PTAT_VAR and CTAT_VAR to I_PTAT and I_CTAT respectively. Hence, PTAT current steering circuit 902 provides a base PTAT current I_PTAT, which can be supplemented with the variable current from adjustable PTAT current source 924. Similarly, CTAT current steering circuit 904 provides a base CTAT current I_CTAT, which can be supplemented with the variable current from adjustable PTAT current source 924.

If the maximum current from adjustable current source 924 is I_PTAT_MAX, then PTAT_VAR=a*I_PTAT_MAX. Similarly, if the maximum current from adjustable current source 926 I_CTAT_MAX, then CTAT_VAR=b*I_CTAT_MAX, where "a" and "b" are ratio factors being either zero or summing to 1. It should be noted that I_PTAT_MAX and I_CTAT_ MAX can be the same or different in magnitude. The resulting variable current I_VAR can thus be expressed as I_VAR=(I_PTAT+I_PTAT_VAR)+(I_CTAT+I_CTAT_ VAR). Assuming that I_PTAT and I_CTAT are constant for a specific level of V_GAIN− and V_GAIN+, then I_VAR should be at substantially the same magnitude for different ratio factors of "a" and "b"

For example, if both adjustable current sources 924 and 926 are configured for 50% output, then ratio factors "a" and "b" will be 0.5 and 0.5 respectively. If on the other hand, ratio factors "a" and "b" are zero, then both adjustable current sources are turned off. If PTAT current source 912 and CTAT current source 920 provide substantially the same magnitude of current, then about half of I_VAR will be I_PTAT and the other half will be I_CTAT. In the embodiment of FIG. 21, adjustable current sources 924 and 926 can be implemented with the circuits shown in FIGS. 18a and 18b to add supplemental current to the I_PTAT and I_CTAT currents. In an alternate embodiment, the adjustable current sources can remove currents from I_PTAT and I_CTAT instead.

Figure 22A:
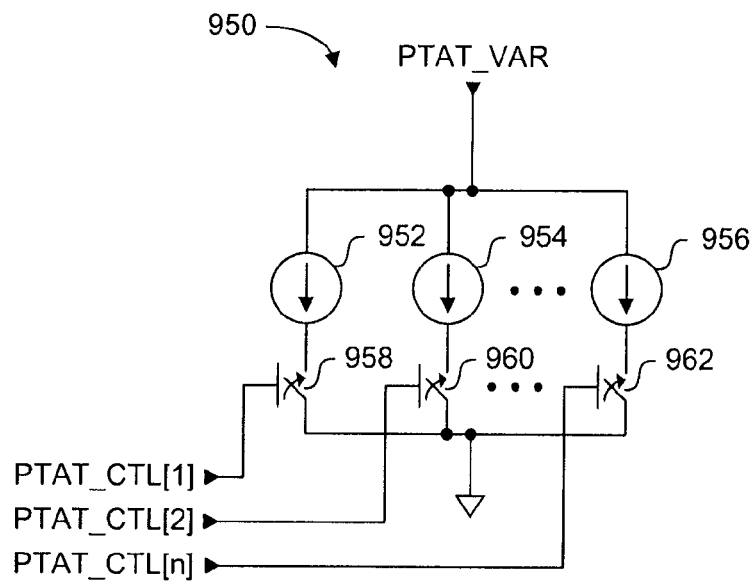
FIG. 22a is a circuit schematic showing an alternate adjustable PTAT current source; and, FIG. 22b is a circuit schematic showing an alternate adjustable CTAT current source.

FIG. 22a is a circuit schematic showing an alternate adjustable PTAT current source which can be used as adjustable current source 924 in the temperature dependent current control circuit 900 shown in FIG. 21. Adjustable current source 950 includes a switch circuit consisting of switch elements 952, 954 and 956, each connected in series with corresponding PTAT current source 958, 960 and 962. Each PTAT current source can be configured to provide a specific amount of current. For example, each PTAT current source can be binary weighted or temperature weighted. Accordingly, the switch elements 952, 954 and 956 will selectively couple a combination of one or more current sources 958, 960 and 962 to voltage supply VSS in response to digital control signals PTAT_CTL[1], PTAT_CTL[2] and PTAT_CTL[n], thereby changing the magnitude of I_PTAT. PTAT_VAR is a sum of the currents provided by the current sources coupled to VSS, is referred to as a negative current as it is the current being removed from I_PTAT.

Figure 22B:
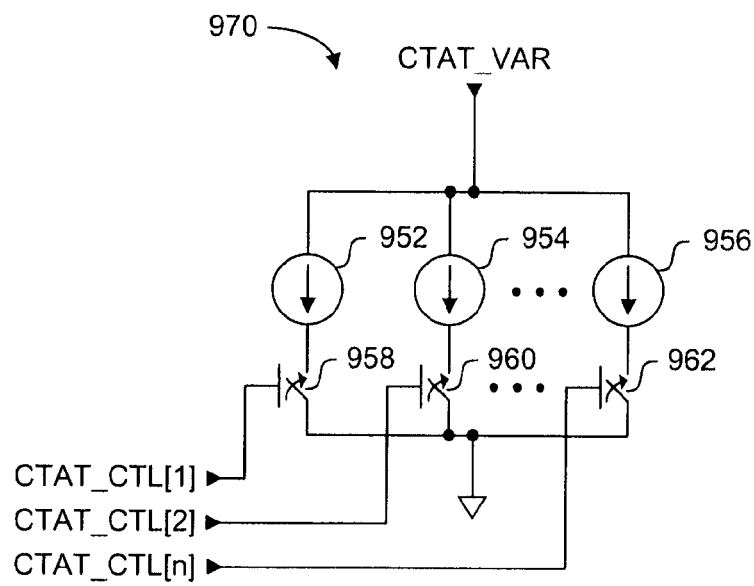

FIG. 22b is a circuit schematic showing an alternate adjustable CTAT current source which can be used as adjustable current source 926 in the temperature dependent current control circuit 900 shown in FIG. 21. Adjustable current source 970 includes a switch circuit consisting of switch elements 972, 974 and 976, each connected in series with corresponding CTAT current source 978, 980 and 982. Each CTAT current source can be configured to provide a specific amount of current. For example, each CTAT current source can be binary weighted or temperature weighted. Accordingly, the switch elements 972, 974 and 976 will selectively couple a combination of one or more current sources 978, 980 and 982 to VSS in response to digital control signals CTAT_CTL[1], CTAT_CTL[2] and CTAT_CTL[n], thereby changing the magnitude of I_CTAT. CTAT_VAR is a sum of the currents provided by the current sources coupled to VSS, is referred to as a negative current as it is the current being removed from I_CTAT.

If the adjustable current sources 950 and 970 are used in the temperature dependent current control circuit 900 of FIG. 21, then the maximum currents provided by adjustable current sources 950 and 970 will be I_PTAT_MAX and I_CTAT_ MAX respectively. Therefore, PTAT_VAR=a*I_PTAT_MAX and CTAT_VAR=b*I_CTAT_MAX, where "a" and "b" are ratio factors being either zero or summing to 1. Accordingly, I_VAR=(I_PTAT−PTAT_VAR)+(I_CTAT−CTAT_VAR).

As shown by the previously described embodiments, the current provided to the variable gain amplifier can be directly adjusted with the same gain control voltage used to control the gain of the variable gain amplifier for reducing power consumption at low levels of gain. Furthermore, to reduce temperature effects this adjustable current can be tailored to include a ratio of PTAT and CTAT current to optimize the performance of the variable gain amplifier.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. a gain system for a wireless transmitter core comprising:
an automatic gain control circuit for providing differential gain control voltages (V GAIN+, V GAIN−) corresponding to a level of gain in response to a control signal (VCONT), the automatic gain control circuit controlling the differential gain control voltages to have a linear relationship with the control signal;
a variable gain amplifier for amplifying a data signal IN with the level of gain in response to the differential gain control voltages, an output power of the variable gain amplifier varying between a minimum output power at a minimum gain level of the differential gain control voltages and a maximum output power at a maximum gain level of the differential gain control voltages, the variable gain amplifier receiving a variable current (I VAR) for operating the variable gain amplifier; and,
a current control circuit for adjusting the variable current in response to the differential gain control voltages, the current control circuit minimizing the variable current at the minimum output power and maximizing the variable current at the maximum output power; wherein the current control circuit includes a combination of a proportional to absolute temperature current source and a complementary to absolute temperature current source to generate the variable current.

2. The gain system of claim 1, wherein the current control circuit includes
a current steering circuit for steering a portion of a bias current to an output node as a reference current in response to a first control voltage of the differential gain control voltages, and,
a current mirror circuit for receiving the reference current and generating the variable current corresponding in magnitude to the reference current.

3. The gain system of claim 2, wherein the current steering circuit includes
a first input n-channel transistor connected in series between a load device coupled to VDD and a common node, the first input n-channel transistor gate being coupled to the first control voltage, a second input n-channel transistor connected in series between the current mirror circuit and the common node, the second input n-channel transistor gate being coupled to a second control voltage of the differential gain control voltages, and a bias current source coupled to the common node for providing the bias current.

4. The gain system of claim 3, wherein the variable gain amplifier includes an input stage for coupling a current to a differential amplification stage in response to the data signal, the differential amplification stage providing an amplified signal corresponding to the data signal in response to the differential gain control voltages, and a mirror transistor for providing the current to the input stage, and, a diode-connected transistor for receiving the variable current, the diode-connected transistor being arranged in a current mirror configuration with the mirror transistor.

5. The gain system of claim 3, wherein the bias current source includes a hybrid current source for providing a combination of proportional to absolute temperature (PTAT) current and complementary to absolute temperature (CTAT) current.

6. The gain system of claim 5, wherein the hybrid current source includes an adjustable PTAT current source for providing the PTAT current, an adjustable CTAT current source for providing the CTAT current, a current summer for combining the PTAT current and the CTAT current, and a mirror transistor arranged in a current mirror configuration with the current summer for providing the bias current, the bias current having a magnitude corresponding to the sum of the PTAT current and the CTAT current.

7. The gain system of claim 6, wherein the adjustable PTAT current source includes at least two PTAT current sources for providing different PTAT current, and a PTAT switch circuit for selectively coupling at least one of the at least two PTAT current sources to a common node for providing the PTAT current.

8. The gain system of claim 7, wherein the adjustable CTAT current source includes at least two CTAT current sources for providing different CTAT currents, and a CTAT switch circuit for selectively coupling at least one of the at least two CTAT current sources to another common node for providing the CTAT current.

9. The gain system of claim 8, wherein the adjustable PTAT current source is programmed to provide a first ratio factor of the bias current and the adjustable CTAT current source is programmed to provide a second ratio factor of the bias current, the first ratio factor and the second ratio factor summing to approximately 1.

10. The gain system of claim 9, wherein the adjustable PTAT current source is programmed in response to a first ratio control word and the adjustable CTAT current source is programmed in response to a second ratio control word.

11. The gain system of claim 10, wherein the first ratio control word and the second ratio control word are adjusted in response to a sensed temperature.

12. The gain system of claim 11, further including a temperature sensor for providing an analog signal corresponding to the sensed temperature, and, a temperature decoder for generating the first ratio control word and the second ratio control word in response to the analog signal received from the temperature sensor.

13. The gain system of claim 12, wherein the temperature decoder includes an analog to digital converter for providing a digital output signal corresponding to the analog signal, a first decoder for receiving the digital output signal and for generating the first ratio control signal, and a second decoder for receiving the digital output signal and for generating the second ratio control signal.

14. A gain system for a wireless transmitter core comprising:

a variable gain amplifier receiving a variable current for amplifying a data signal with the level of gain in response to differential gain control voltages (V GAIN+, V GAIN−), an output power of the variable gain amplifier varying between a minimum output power at a minimum gain level of the differential gain control voltages and a maximum output power at a maximum gain level of the differential gain control voltages, the variable gain amplifier receiving a variable current (I VAR) for operating the variable gain amplifier;

a temperature sensor for providing an analog signal corresponding to a sensed temperature, a temperature decoder for generating a first ratio control word and a second ratio control word in response to the analog signal received from the temperature sensor; and, a current control circuit for providing a proportional to absolute temperature current (PTAT) in response to the first ratio control word and a complementary to absolute temperature current (CTAT) in response to the second ratio control word, the current control circuit summing the PTAT current and the CTAT current to provide the variable current.

15. The gain system of claim 14, wherein the current control circuit includes a PTAT current steering circuit for generating the PTAT current in response to the differential gain control voltages, a CTAT current steering circuit for generating the CTAT current in response to the differential gain control voltages, and, a current weighting circuit for receiving the PTAT current and the CTAT current, and for providing the variable current corresponding to a sum of the PTAT current, a supplemental PTAT current, the CTAT current and a supplemental CTAT current.

16. The gain system of claim 15, wherein the current weighting circuit includes an adjustable PTAT current source for providing the supplemental PTAT current in response to the first ratio control word, and an adjustable CTAT current source for providing the supplemental CTAT current in response to the second ratio control word.

17. The gain system of claim 16, wherein the adjustable PTAT current source includes at least two PTAT current sources for providing different PTAT currents, and a PTAT switch circuit for selectively coupling at least one of the at least two PTAT current sources to a voltage supply (VDD or VSS) for providing the supplemental PTAT current.

18. The gain system of claim 17, wherein the adjustable CTAT current source includes
   at least two CTAT current sources for providing different CTAT currents, and
   a CTAT switch circuit for selectively coupling at least one of the at least two CTAT current sources to the voltage supply (VDD or VSS) for providing the supplemental CTAT current.

19. The gain system of claim 17, wherein the voltage supply is VDD.

20. The gain system of claim 17, wherein the voltage supply is VSS, the supplemental PTAT current and the supplemental CTAT current are negative currents.

21. The gain system of claim 15, wherein the PTAT current steering circuit includes
   a pair of input n-channel transistors connected in parallel to a common node, the pair of input n-channel transistors being controlled by the differential gain control voltages for providing a portion of a PTAT reference current,
   a PTAT current source coupled to the common node for providing the PTAT reference current, and
   a current mirror circuit for receiving the PTAT reference current and generating the PTAT current corresponding in magnitude to the PTAT reference current.

22. The gain system of claim 21, wherein the CTAT current steering circuit includes
   another pair of input n-channel transistors connected in parallel to a another common node, the another pair of input n-channel transistors being controlled by the differential gain control voltages for providing a portion of a CTAT reference current,
   a CTAT current source coupled to the another common node for providing the CTAT reference current, and
   another current mirror circuit for receiving the CTAT reference current and generating the CTAT current corresponding in magnitude to the CTAT reference current.

* * * * *